(12) United States Patent
Lee et al.

(10) Patent No.: US 12,538,695 B2
(45) Date of Patent: Jan. 27, 2026

(54) APPARATUS AND METHOD OF MANUFACTURING DISPLAY APPARATUS

(71) Applicant: Samsung Display Co., Ltd., Yongin-si (KR)

(72) Inventors: Gihyun Lee, Yongin-si (KR); Suk Ki, Yongin-si (KR); Songi Kim, Yongin-si (KR); Yongjin Bae, Yongin-si (KR); Jooheon Seon, Yongin-si (KR); Juwon Lee, Yongin-si (KR); Jinseok Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 516 days.

(21) Appl. No.: 17/504,354

(22) Filed: Oct. 18, 2021

(65) Prior Publication Data

US 2022/0158143 A1  May 19, 2022

(30) Foreign Application Priority Data

Nov. 16, 2020  (KR) .......................... 10-2020-0153078

(51) Int. Cl.
| | | |
|---|---|---|
| *H10K 59/88* | (2023.01) | |
| *H10K 59/80* | (2023.01) | |
| *H10K 71/10* | (2023.01) | |
| *H10K 71/40* | (2023.01) | |
| *H10K 59/12* | (2023.01) | |

(52) U.S. Cl.
CPC ....... *H10K 59/88* (2023.02); *H10K 59/80522* (2023.02); *H10K 71/191* (2023.02); *H10K 71/421* (2023.02); *H10K 59/1201* (2023.02)

(58) Field of Classification Search
CPC ........ H01L 21/00; H10K 71/00; H10K 59/88; H10K 71/191; H10K 71/421; H10K 59/1201
See application file for complete search history.

(56) References Cited

U.S. PATENT DOCUMENTS

| | | |
|---|---|---|
| 8,388,399 B2 | 3/2013 | Kim et al. |
| 8,895,970 B2 | 11/2014 | Kim et al. |
| (Continued) | | |

FOREIGN PATENT DOCUMENTS

| | | |
|---|---|---|
| KR | 10-2004-0057150 | 7/2004 |
| KR | 10-2005-0101578 | 10/2005 |
| (Continued) | | |

*Primary Examiner* — Mohammad M Choudhry
(74) *Attorney, Agent, or Firm* — Womble Bond Dickinson (US) LLP

(57) ABSTRACT

An apparatus for manufacturing a display apparatus includes a movable portion to which a display substrate including a pattern part is attached, wherein the pattern part includes a dummy electrode and an organic functional layer covering the dummy electrode, a processor configured to cause a laser to irradiate the display substrate in a first irradiating process, a measurement unit configured to measure the display substrate to which the laser has irradiated in the first irradiating process, and a controller configured to receive data measured by the measurement unit and control the processor to cause the laser to irradiate the laser in a second irradiating process using at least one different parameter than what was used in the first irradiating process.

7 Claims, 24 Drawing Sheets

(56) References Cited

U.S. PATENT DOCUMENTS

| | | | |
|---|---|---|---|
| 9,076,983 B2 | 7/2015 | Kim et al. | |
| 9,362,345 B2 | 6/2016 | Jeong et al. | |
| 9,515,294 B2 | 12/2016 | Han et al. | |
| 9,780,158 B2 | 10/2017 | Lee et al. | |
| 2008/0287028 A1 | 11/2008 | Ozawa | |
| 2018/0006098 A1* | 1/2018 | Hong | H10K 59/1213 |
| 2020/0243329 A1* | 7/2020 | Noma | H01L 21/78 |

FOREIGN PATENT DOCUMENTS

| | | |
|---|---|---|
| KR | 10-2008-0041913 | 5/2008 |
| KR | 10-2012-0119089 A | 10/2012 |
| KR | 10-1502430 | 3/2015 |
| KR | 10-2015-0102180 | 9/2015 |
| KR | 10-1560272 | 10/2015 |
| KR | 10-2016-0053043 A | 5/2016 |
| KR | 10-2016-0066673 | 6/2016 |
| KR | 10-1938760 | 1/2019 |
| KR | 10-2020-0080676 A | 7/2020 |

\* cited by examiner

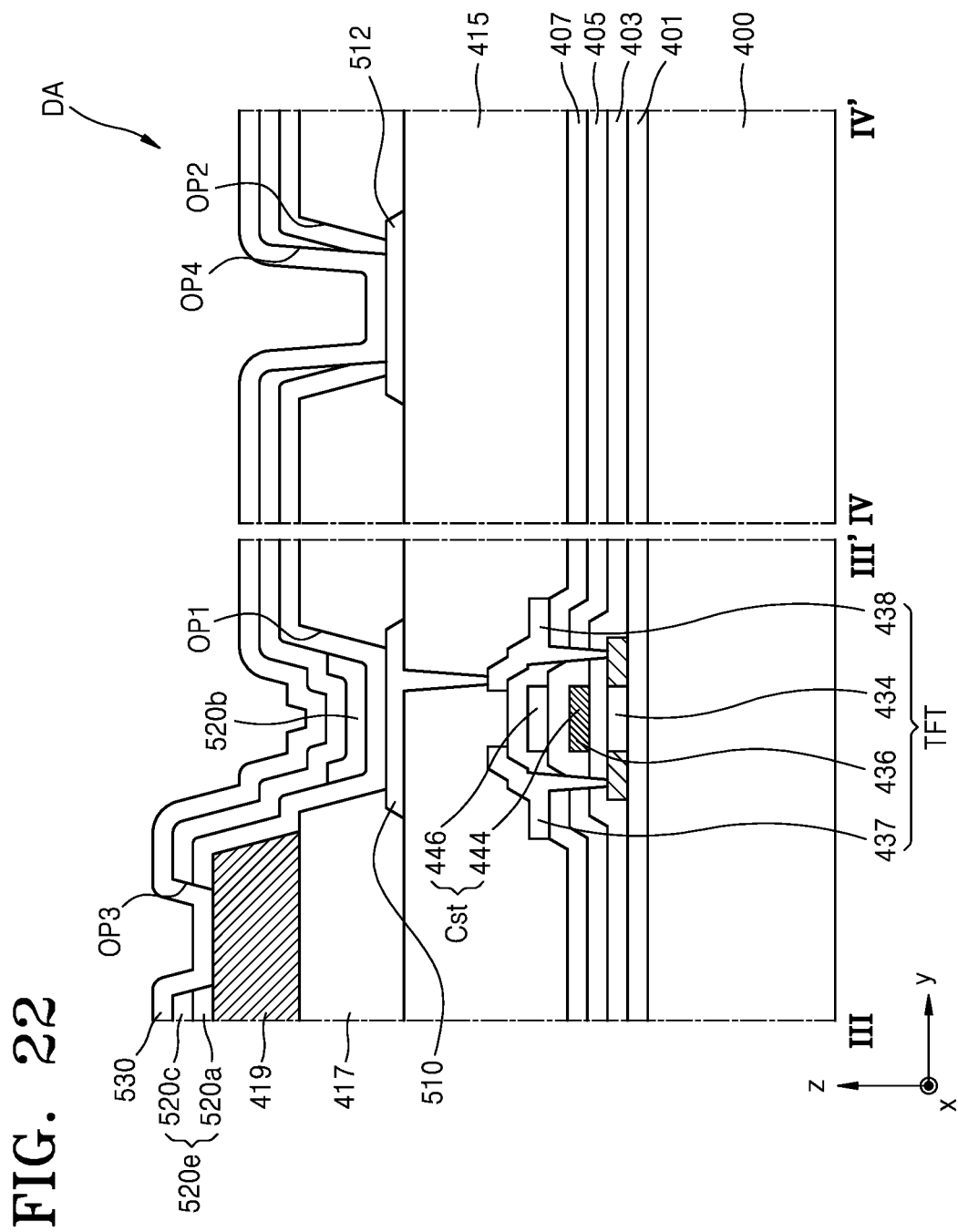

APPARATUS AND METHOD OF MANUFACTURING DISPLAY APPARATUS

CROSS-REFERENCE TO RELATED APPLICATION

This application claims priority from and the benefit of Korean Patent Application No. 10-2020-0153078, filed on Nov. 16, 2020, which is hereby incorporated by reference for all purposes as if fully set forth herein.

BACKGROUND

Field

Embodiments/implementations of the invention relate generally to an apparatus and method of manufacturing a display apparatus, and more specifically, to an apparatus and method of manufacturing a display apparatus having improved workability.

Discussion of the Background

Display apparatuses visually display data. A display apparatus is used as a display for a small product such as a mobile phone or is used as a display for a large product such as a television.

A display apparatus includes a plurality of pixels that emit light by receiving an electrical signal to display an image to the outside (i.e., external to the display apparatus). Each pixel includes a light-emitting device. For example, an organic light-emitting display apparatus includes an organic light-emitting diode (OLED) as a light-emitting device. In general, in an organic light-emitting display apparatus, a thin-film transistor and an OLED are formed on a substrate, and the OLED emits light by itself.

As display apparatuses have recently been used in various ways, various designs have been attempted to improve the quality of display apparatuses.

The above information disclosed in this Background section is only for understanding of the background of the inventive concepts, and, therefore, it may contain information that does not constitute prior art.

SUMMARY

One or more embodiments include an apparatus and method of manufacturing a display apparatus.

Additional features of the inventive concepts will be set forth in the description which follows, and in part will be apparent from the description, or may be learned by practice of the inventive concepts.

According to one or more embodiments, an apparatus for manufacturing a display apparatus includes a movable portion to which a display substrate including a pattern part is attached, wherein the pattern part includes a dummy electrode and an organic functional layer covering the dummy electrode, a processor configured to cause a laser to irradiate the display substrate in a first irradiating process, a measurement unit configured to measure the display substrate to which the laser has irradiated in the first irradiating process, and a controller configured to receive data measured by the measurement unit and control the processor to cause the laser to irradiate the display substrate in a second irradiating process using at least one different parameter than what was used in the first irradiating process.

The processor may include a light source, and a scanner configured to adjust a direction of a laser emitted from the light source, wherein the processor is further configured to irradiate a laser to the organic functional layer located on the dummy electrode.

At least a part of the organic functional layer may be etched.

The measurement unit may be further configured to measure an etched position, shape, and depth of the at least a part of the organic functional layer.

The controller may be further configured to control at least one of power density and power of the laser.

The apparatus may further include a pixel electrode and an auxiliary electrode located on the display substrate, wherein the organic functional layer covers the pixel electrode and the auxiliary electrode.

The pixel electrode, the auxiliary electrode, and the dummy electrode may be located on a same layer.

The processor may be further configured to etch at least a part of the organic functional layer located on the auxiliary electrode.

The display substrate may further include a counter electrode located on the pixel electrode and the auxiliary electrode, wherein the auxiliary electrode and the counter electrode directly contact each other.

The pattern part may include at least three pattern marks.

Each of the at least three pattern marks may include the dummy electrode, and the organic functional layer located on the dummy electrode.

The pattern part may include an alignment key and at least two pattern marks.

The display substrate may include a cutting line, and the pattern part is located inside or outside the cutting line.

According to one or more embodiments, a method of manufacturing a display apparatus includes aligning a display substrate including a pattern part, performing first drilling by causing a laser to irradiate the pattern part, measuring a surface of the first-drilled pattern part, and adjusting at least one of power density and power of the laser, and performing second drilling by causing the laser to irradiate the display substrate having the first-drilled pattern part by using the at least one of the adjusted power density and the adjusted power.

Before the aligning of the display substrate including the pattern part, the method may further include forming a pixel electrode, an auxiliary electrode, and a dummy electrode on the display substrate, forming a first organic insulating layer including a first opening through which at least a part of the pixel electrode is exposed to an exterior of the display substrate, a second opening through which at least a part of the auxiliary electrode is exposed to an exterior of the display substrate, and a third opening through which at least a part of the dummy electrode is exposed to an exterior of the display substrate, and forming an organic functional layer on the pixel electrode, the auxiliary electrode, and the dummy electrode at least parts of which are exposed to an exterior of the display substrate.

The pixel electrode, the auxiliary electrode, and the dummy electrode may be formed on a same layer.

The pattern part may include the dummy electrode, and the organic functional layer located on the dummy electrode, wherein the performing of the first drilling by irradiating the laser to the pattern part includes etching at least a part of the organic functional layer by irradiating the laser to the organic functional layer located on the dummy electrode.

The performing of the second drilling by irradiating the laser to the display substrate may include etching at least a part of the organic functional layer by irradiating the laser to the organic functional layer located on the auxiliary electrode.

After the performing of the second drilling by irradiating the laser to the display substrate, the method may further include forming a counter electrode on the pixel electrode and the auxiliary electrode.

The organic functional layer may be located between the pixel electrode and the counter electrode, and the auxiliary electrode and the counter electrode directly contact each other.

The display substrate may include a cutting line, and the pattern part may be located inside or outside the cutting line.

In the forming of the first organic insulating layer, a second organic insulating layer may be formed on the first organic insulating layer, and the pattern part may include the auxiliary electrode, the second organic insulating layer, and the organic functional layer formed on the second organic insulating layer.

The performing of the first drilling by irradiating the laser to the pattern part may include etching at least a part of the organic functional layer by irradiating the laser to the organic functional layer formed on the second organic insulating layer.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventive concepts.

FIGS. 18, 19, 20, 21, and 22 are cross-sectional views for describing a method of manufacturing a display apparatus according to an embodiment.

DETAILED DESCRIPTION

Figure 1:
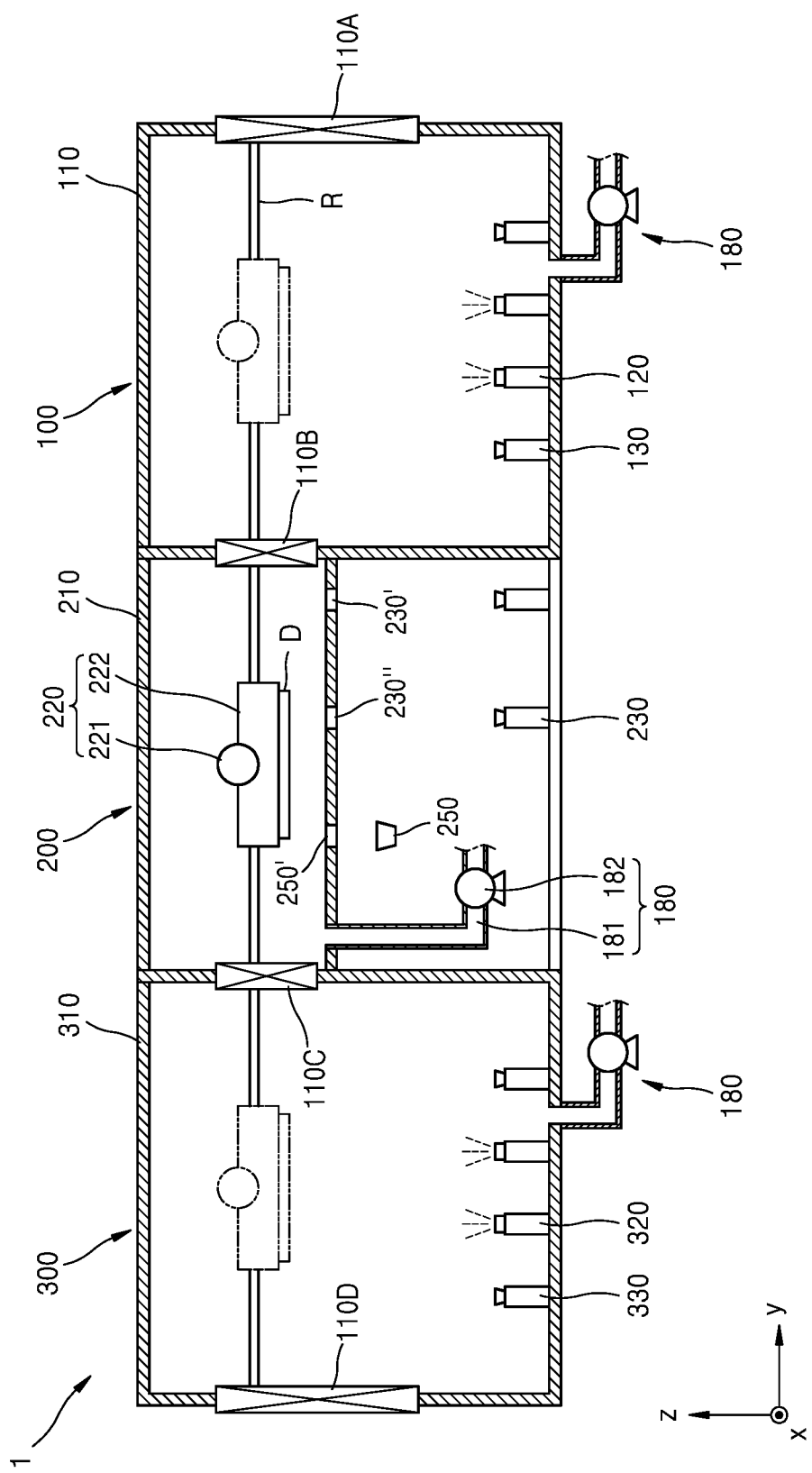
FIG. 1 is a cross-sectional view of an apparatus for manufacturing a display apparatus according to an embodiment that has been constructed according to principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As is customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the inventive concepts. Further, the blocks, units, and/or modules of some embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, embodiments will be described in detail with reference to the accompanying drawings, wherein the same or corresponding elements are denoted by the same reference numerals throughout.

Figure 2:
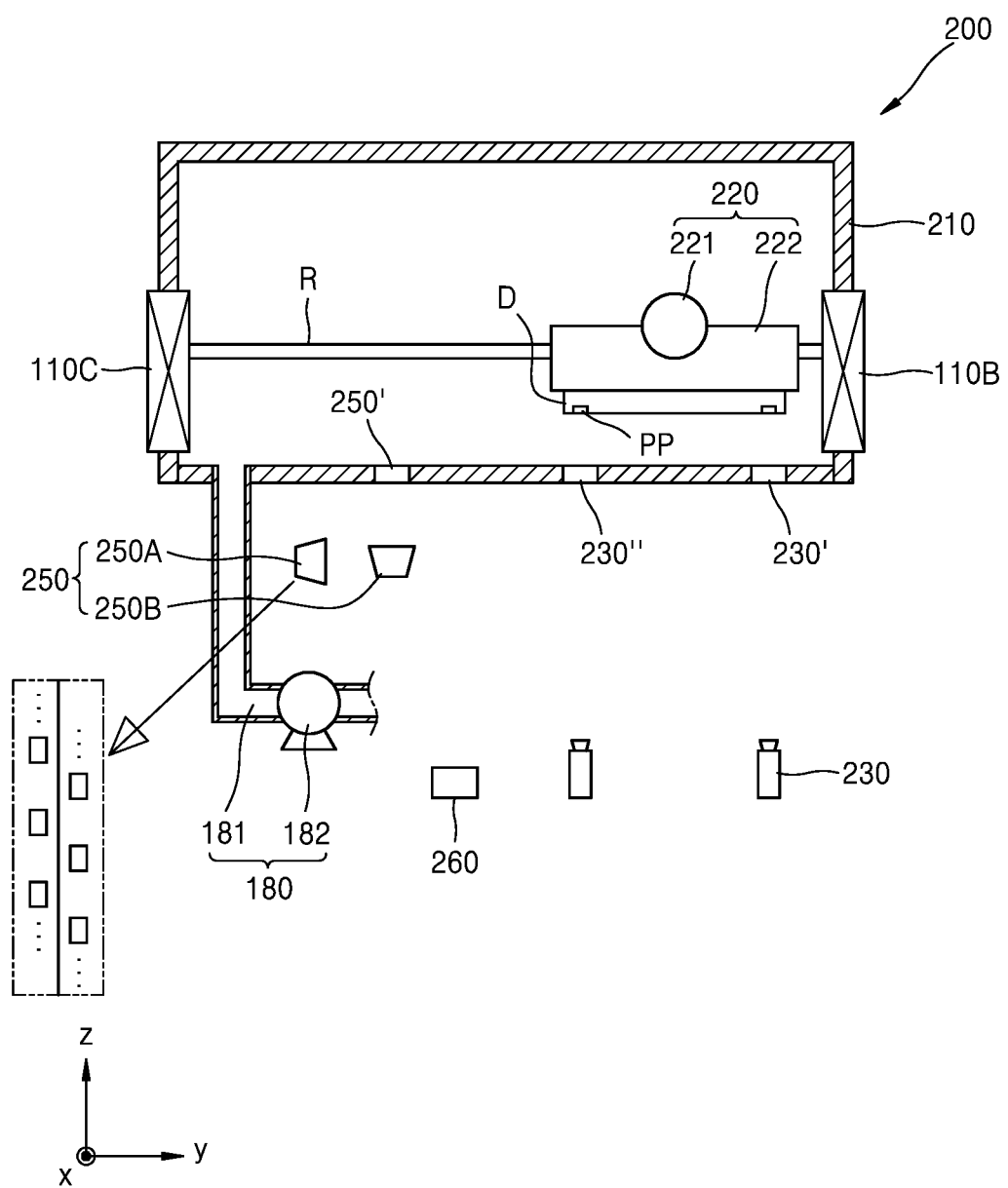
FIG. 2 is a cross-sectional view of an apparatus for manufacturing a display apparatus according to an embodiment.

FIG. 1 is a cross-sectional view of an apparatus for manufacturing a display apparatus according to an embodiment that has been constructed according to principles of the invention. FIG. 2 is a cross-sectional view of an apparatus for manufacturing a display apparatus according to an embodiment.

Referring to FIGS. 1 and 2, an apparatus 1 for manufacturing a display apparatus may include an organic material deposition unit 100, a laser processing unit 200, and an electrode deposition unit 300.

The apparatus 1 may include a movable portion 220 to which a display substrate D is attached, and the movable portion 220 may include an attached portion 222, and a rotating portion 221 for rotating the attached portion 222.

The movable portion 220 may move by sequentially performing an organic material deposition process, a laser processing process, and an electrode deposition process on a surface of the display substrate D through a rail R (see FIG. 2 and FIG. 4) that penetrates the organic material deposition unit 100, the laser processing unit 200, and the electrode deposition unit 300.

Although the display substrate D moves through one rail in FIG. 1, a plurality of rails may be provided in alternative implementations, and the movable portion 220 may move through a magnetic levitation wireless charging system without a rail in another alternative implementation.

The organic material deposition unit 100 may include a first chamber 110, an organic material deposition source 120, a first measurement unit 130, and a pressure controller 180, and the laser processing unit 200 may include a second chamber 210, a pressure controller 180, a second measurement unit 230, a processor 250, and a controller 260. Also, the electrode deposition unit 300 may include a third chamber 310, a pressure controller 180, an electrode deposition source 320, and a third measurement unit 330.

Each of the first through third chambers 110, 210, and 310 may be formed to have an internal space and an open portion. First through third gate valves 110A, 110B, 110C, and 110D may be respectively provided in the open portions of the first through third chambers 110, 210, and 310 to selectively open and close the open portions of the first through third chambers 110, 210, and 310.

Although a size of the second chamber 210 is different from sizes of the first chamber 110 and the third chamber 310 in FIG. 1, sizes of the first through third chambers 110, 210, and 310 may be the same in alternative implementations. Also, although sizes of the first chamber 110 and the third chamber 310 are the same in FIG. 1, sizes of the first and third chambers 110 and 310 may be different from each other in alternative implementations.

Each of the first through third measurement units 130, 230, and 330 may capture an image of a position of the display substrate D. In this case, the display substrate D may be aligned by moving the display substrate D based on the images captured by the first through third measurement units 130, 230, and 330. For example, when the display substrate D is inclined, each of the first through third measurement units 130, 230, and 330 may capture an image of a pattern part PP and a position of the display substrate D may be adjusted to correspond to a preset position by moving the display substrate D based on the captured images. In this case, the movable portion 220 may include a position adjusting member (not shown) for changing a position of the display substrate D or finely adjusting a position of the movable portion 220 itself.

The pressure controller 180 may be connected to each of the first through third chambers 110, 210, and 310 to adjust a pressure inside each of the first through third chambers 110, 210, and 310 to be similar to an atmospheric pressure or a vacuum. In this case, the pressure controller 180 may include a connection pipe 181 connected to each of the first through third chambers 110, 210, and 310 and a pressure regulation pump 182 located on the connection pipe 181.

The organic material deposition source 120 and the electrode deposition source 320 may be formed in any of various shapes. For example, each of the organic material deposition source 120 and the electrode deposition source 320 may be a point deposition source having one nozzle through which a deposition material is ejected. Also, each of the organic material deposition source 120 and the electrode deposition source 320 may be longitudinally formed, and may be a linear deposition source including a plurality of nozzles or a long hole-shaped nozzle.

The second measurement unit 230 may be located outside the second chamber 210, and may capture an image of a position of the display substrate D through a first transmission window 230' and a second transmission window 230". When the second measurement unit 230 is located outside the second chamber 210, the inside of the second chamber 210 is maintained in a high vacuum state due to the pressure controller 180, thereby preventing or minimizing a malfunction of the second measurement unit 230 or damage to the second measurement unit 230.

The processor 250 may include a light source 250A and a scanner 250B that adjusts a direction of a laser emitted from the light source 250A, and the processor 250 may irradiate a laser to a surface of the display substrate D.

For example, a plurality of light sources 250A may be provided. In this case, the light sources 250A may be disposed in two columns in a first direction (e.g., an x direction), and may be alternately arranged in a second direction (e.g., a y direction) intersecting the first direction. For example, 5 to 15 light sources 250A may be included in each of two columns in the first direction, and a total of 10 to 30 light sources 250A may be included. As another example, the light sources may be arranged in one column in the first direction.

The processor 250 may be located outside the second chamber 210, and may irradiate a laser to a surface of the display substrate D through a third transmission window 250'. Because the inside of the second chamber 210 is maintained in a high vacuum state due to the pressure controller 180, a malfunction of the processor 250 or damage to the processor 250 may be prevented or minimized.

The controller 260 may control the processor 250 by using data on a position of an object to be observed and a degree of drilling (etching), received from the second measurement unit 230.

The pressure controller 180 may maintain the inside of the first chamber 110 in an atmospheric pressure state, and after the first gate valve 110A is opened, the display substrate D may be attached to the movable portion 220 and may be inserted into the first chamber 110.

The pressure controller 180 may maintain the inside of the first chamber 110 to be substantially similar to a vacuum. Also, the first measurement unit 130 may capture an image of the display substrate D, and may align the display substrate D by finely driving the movable portion 220 based on the captured image.

Figure 9:
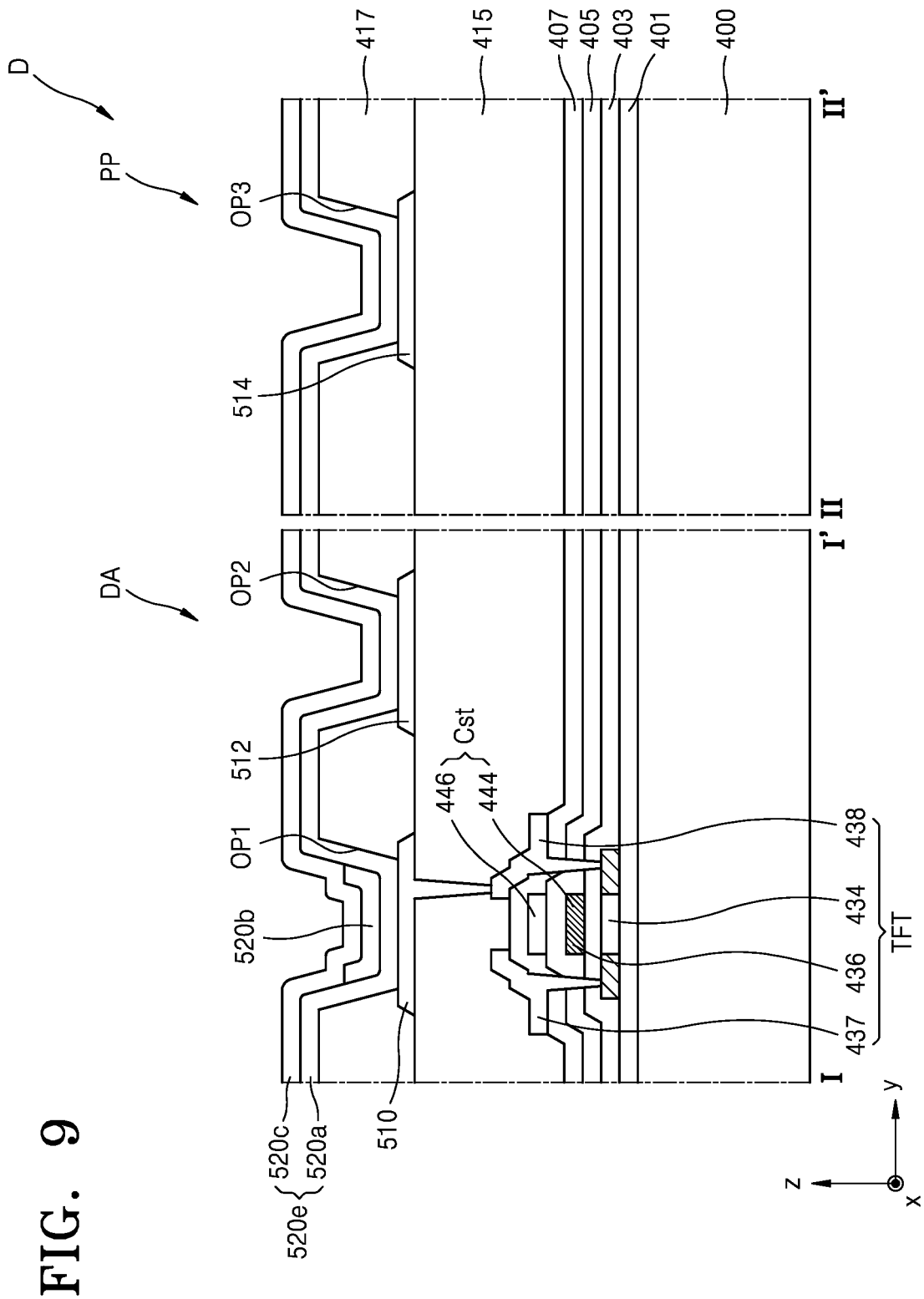

After the display substrate D is aligned, a deposition material supplied from the organic material deposition source 120 may be deposited on the display substrate D to form an organic functional layer 520e (see FIG. 9).

The pressure controller 180 may maintain the inside of the second chamber 210 to be substantially similar to a vacuum, and after the second gate valve 110B is opened, the display substrate D may be attached to the movable portion 220 and may be inserted from the first chamber 110 into the second chamber 210.

The second measurement unit 230 may capture an image of the pattern part PP on the display substrate D through the first transmission window 230' and the second transmission window 230", and may align the display substrate D by finely driving the movable portion 220 based on the captured image.

After the display substrate D is aligned, the processor 250 may irradiate a laser to the display substrate D.

Figure 3:
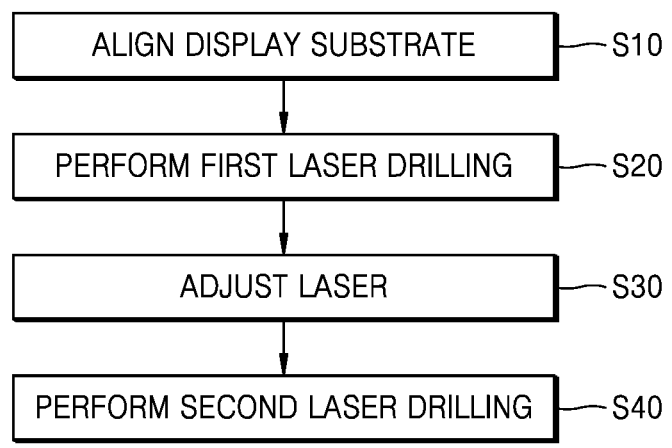
FIG. 3 is a flowchart of a method of manufacturing a display apparatus according to an embodiment.

FIG. 3 is a flowchart of a method of manufacturing a display apparatus according to an embodiment.

Referring to FIG. 3, a method of manufacturing a display apparatus may include operation S10 in which the display substrate D is aligned, operation S20 in which first laser drilling is performed, operation S30 in which a laser is adjusted, and operation S40 in which second laser drilling is performed using the laser that was adjusted in operation S30.

Figure 4:
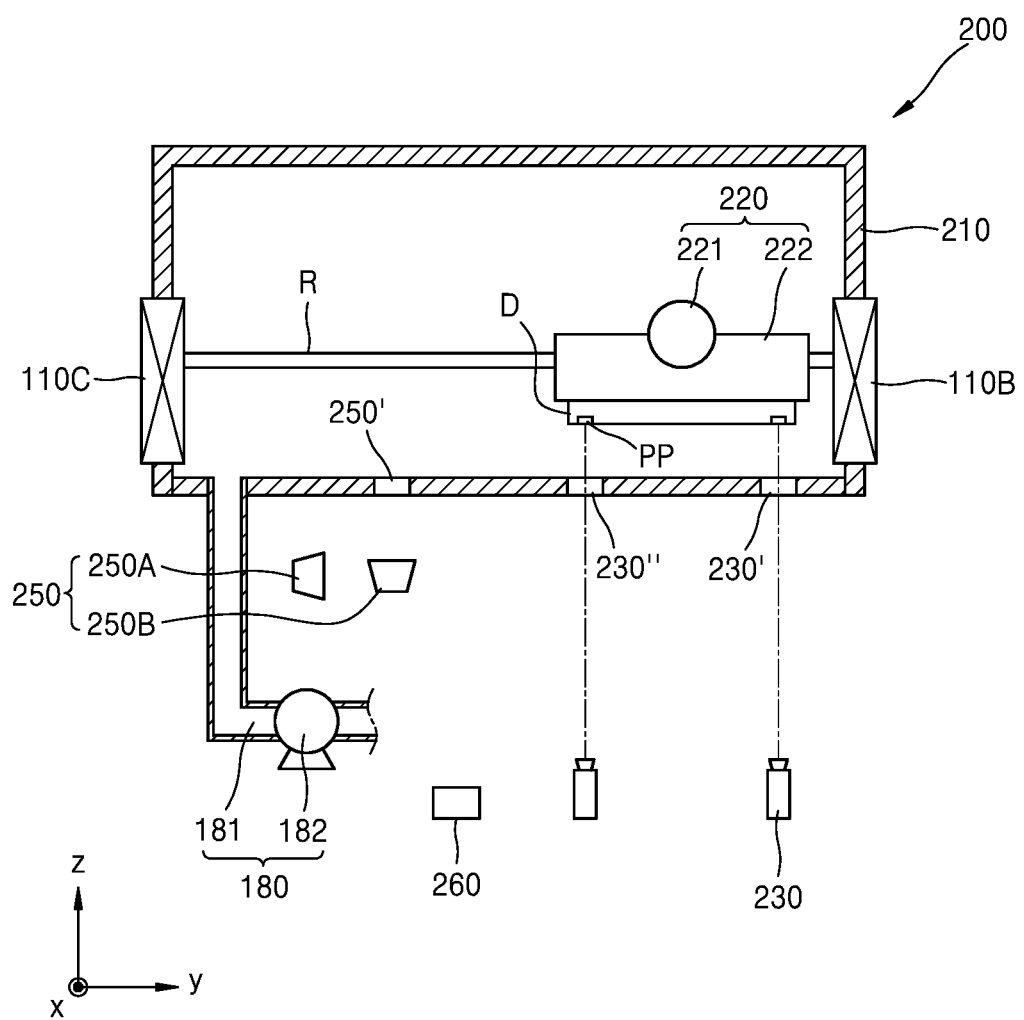
FIG. 4 is a cross-sectional view for describing a method of manufacturing a display apparatus according to an embodiment.

FIG. 4 is a cross-sectional view for describing a method of manufacturing a display apparatus according to an embodiment.

Referring to FIG. 4, an operation of aligning the display substrate D including the pattern part PP may be performed.

The second measurement unit 230 may capture an image of the pattern part PP on the display substrate D through the first transmission window 230' and the second transmission window 230", and may align the display substrate D by using the captured image.

Figure 5:
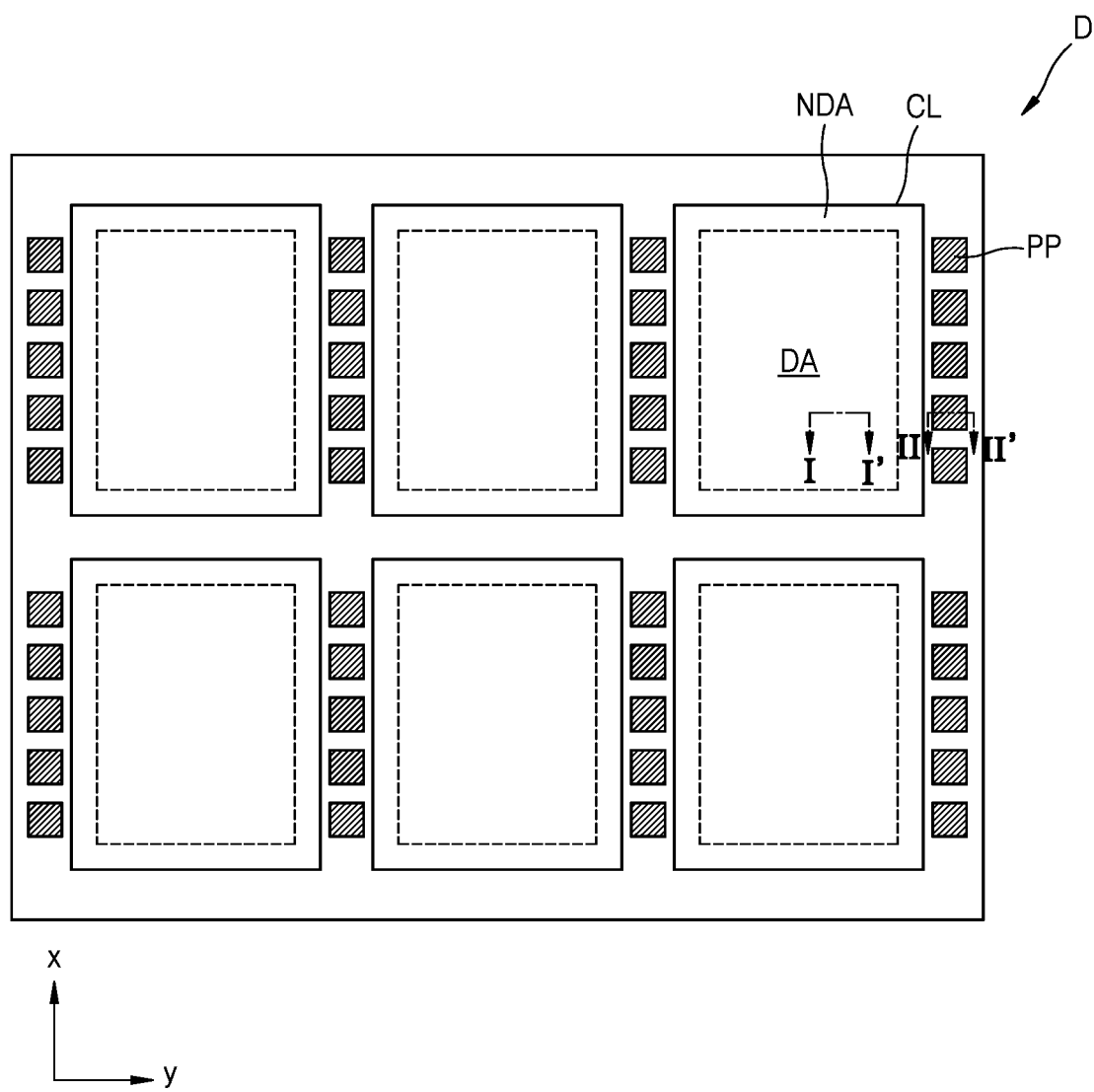
FIG. 5 is a plan view illustrating a display substrate according to an embodiment.
Figure 6A:
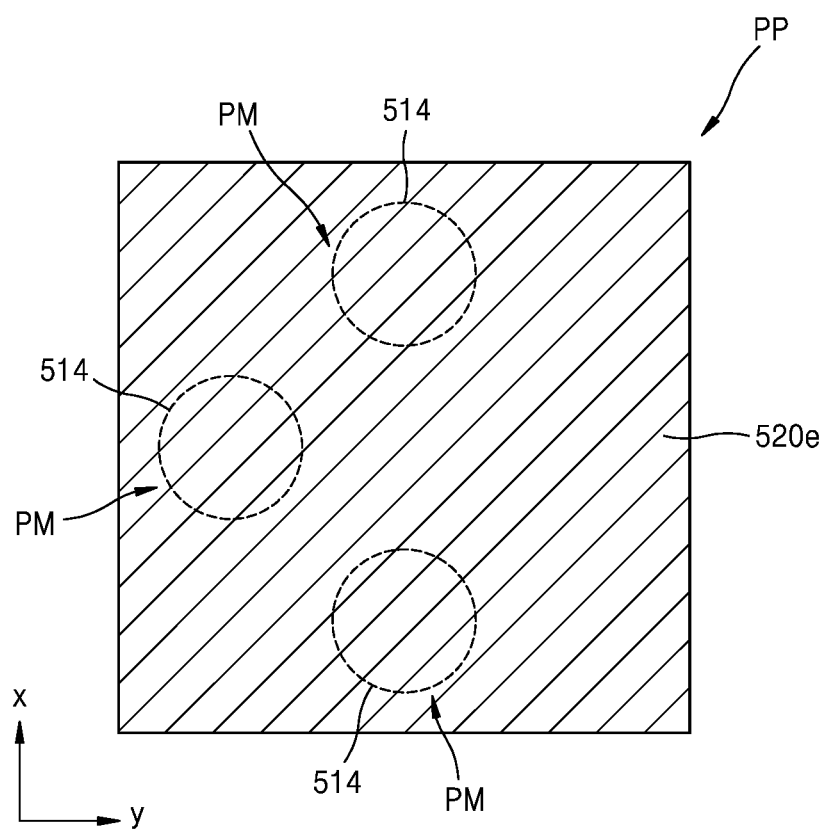
FIGS. 6A and 6B are plan views illustrating a pattern part according to an embodiment.
Figure 6B:
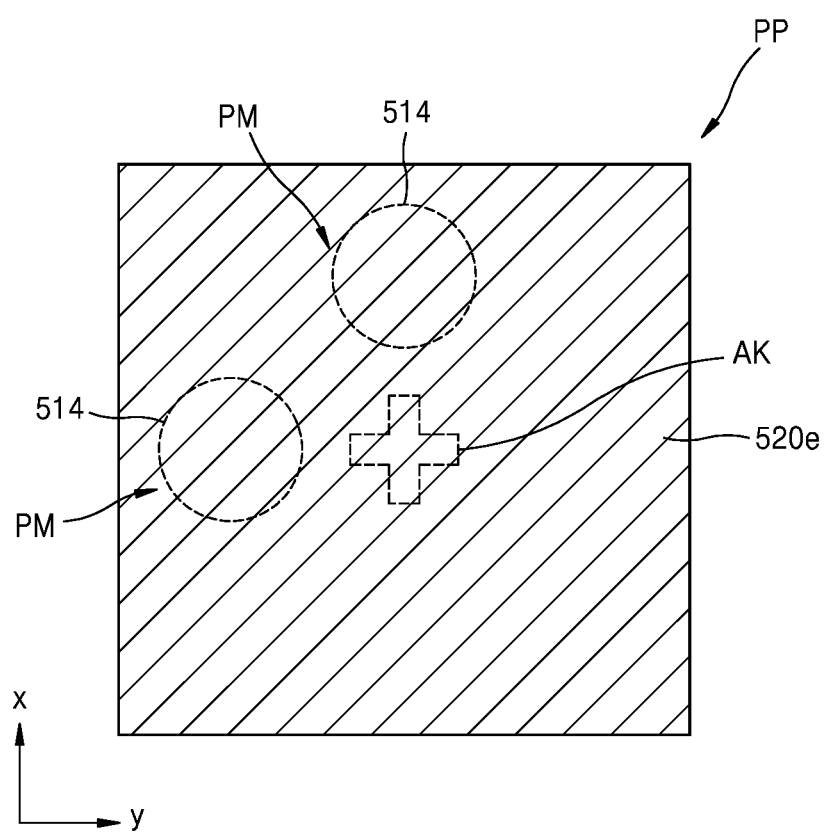

FIG. 5 is a plan view illustrating a display substrate according to an embodiment. FIGS. 6A and 6B are plan views illustrating a pattern part according to an embodiment.

Referring to FIG. 5 and FIGS. 6A and 6B, the display substrate D may include a plurality of display areas DA that are spaced apart from one another and a plurality of non-display areas NDA surrounding the plurality of display areas DA. The display substrate D may include a cutting line CL. The plurality of display areas DA may be divided by a plurality of cutting lines CL.

The display substrate D may include the pattern part PP. Although the pattern part PP is provided outside the cutting line CL in FIG. 5, the disclosure is not limited thereto. The pattern part PP may be provided inside the cutting line CL. For example, the pattern part PP may be located in the display area DA or the non-display area NDA inside the cutting line CL.

For example, 5 pattern parts PP may be provided to correspond to one display area DA. As another example, more or less than 5 pattern parts PP may be provided to correspond to one display area DA.

The pattern part PP may include a dummy electrode 514, and the organic functional layer 520e formed on the dummy electrode 514. The organic functional layer 520e may be integrally provided to cover a plurality of dummy electrodes 514 that are spaced apart from one another.

Although the dummy electrode 514 has a circular shape in FIG. 6A, the disclosure is not limited thereto. The dummy electrode 514 may have any of various shapes such as a quadrangular shape, an elliptical shape, or a triangular shape.

For example, at least three dummy electrodes 514 may constitute one pattern part PP. The second measurement unit 230 may capture images of positions of three dummy electrodes 514, and may align the display substrate D by using the captured images. Because the display substrate D is aligned by using at least three dummy electrodes 514, the alignment accuracy of the display substrate D may be improved.

For example, the pattern part PP may include at least three pattern marks PM. Each pattern mark PM may include the dummy electrode 514, and the organic functional layer 520e formed on the dummy electrode 514. The organic functional layer 520e may be integrally provided to cover the dummy electrodes 514 that are spaced apart from one another.

For example, the pattern marks PM may be arranged in a polygonal shape. For example, when the pattern part PP includes three pattern marks PM, a virtual line connecting the centers of the pattern marks PM may form a triangle. Also, when the pattern part PP includes three or more pattern marks PM, a virtual line connecting the centers of the pattern marks PM may form a polygon. Because the display substrate D is aligned by using the pattern marks PM arranged in a triangular (polygonal) shape, the alignment accuracy of the display substrate D may be improved.

Also, as another example, the pattern part PP may include an alignment key AK. Although the alignment key AK has a cross shape in FIG. 6B, the disclosure is not limited thereto. The alignment key AK may have any of various shapes such as a quadrangular shape, an elliptical shape, a circular shape, or a triangular shape.

When the pattern part PP includes the alignment key AK, the pattern part PP may include at least two pattern marks PM. The second measurement unit 230 may align the display substrate D by using the alignment key AK and the at least two pattern marks PM.

In this case, the alignment key AK and the pattern marks PM may be arranged in a polygonal shape. For example, when the pattern part PP includes the alignment key AK and two pattern marks PM, a virtual line connecting the centers of the alignment key AK and the pattern marks PM may form a triangle. Also, when the pattern part PP includes the alignment key AK and two or more pattern marks PM, a virtual line connecting the centers of the alignment key AK and the pattern marks PM may form a polygonal shape.

Figure 7:
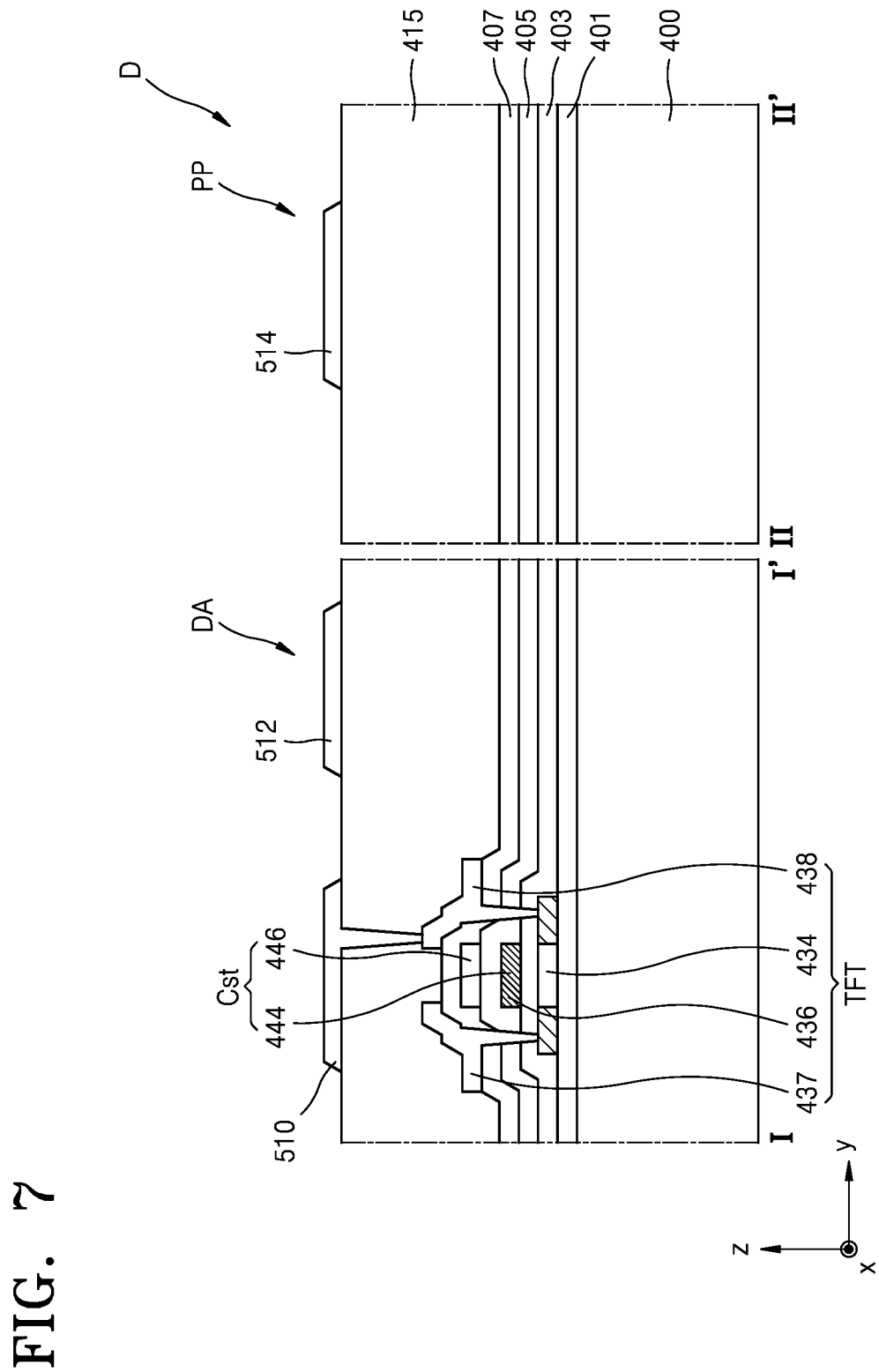
FIGS. 7, 8, and 9 are cross-sectional views for describing a method of manufacturing a display apparatus according to an embodiment.
Figure 8:
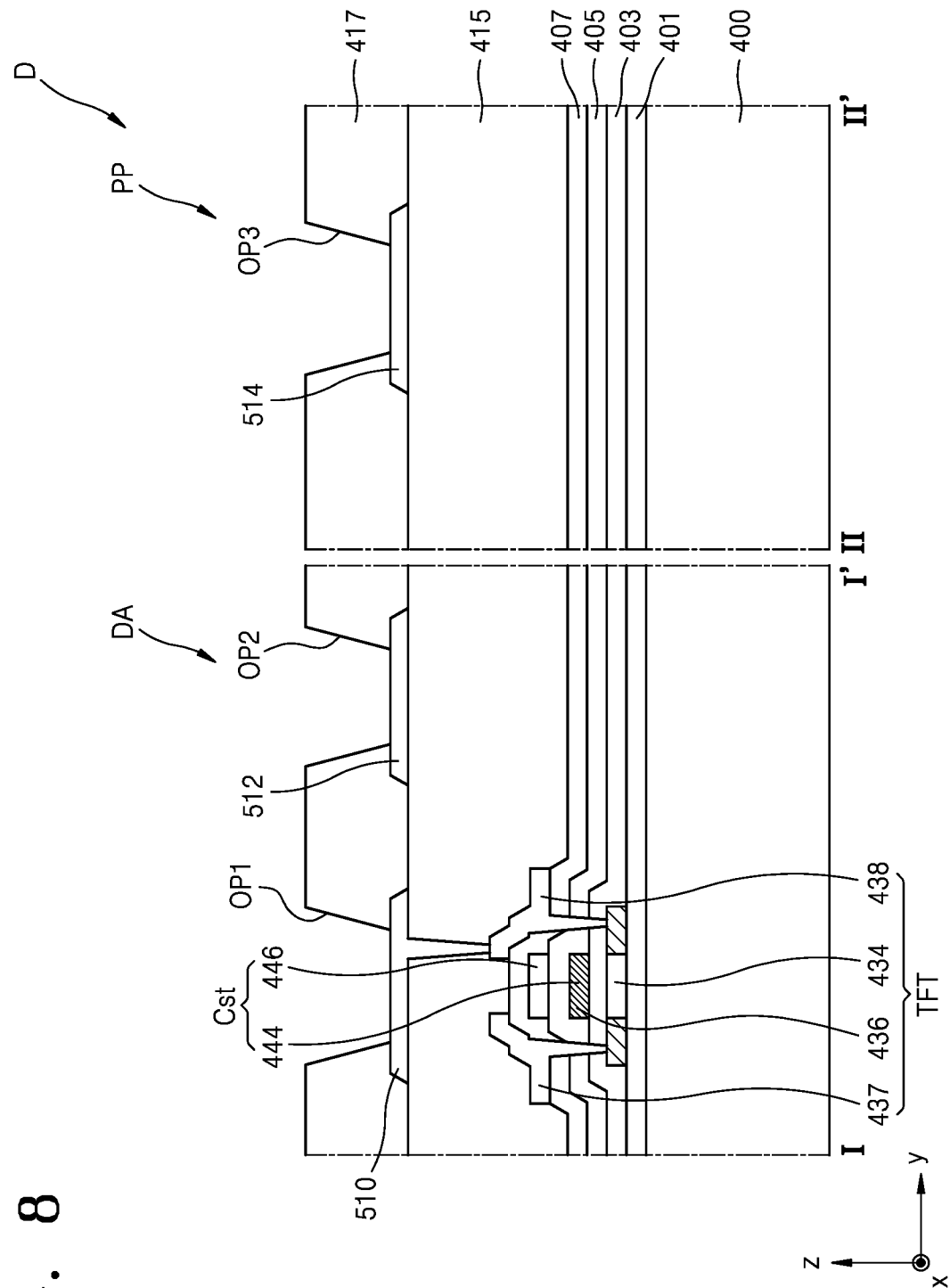

FIGS. 7 through 9 are cross-sectional views for describing a method of manufacturing a display apparatus according to an embodiment. FIGS. 7, 8, and 9 are cross-sectional views taken along lines I-I' and II-II' of FIG. 5.

Referring to FIG. 3 and FIGS. 7 through 9, before operation S10 in which the display substrate D is aligned, the method of manufacturing the display apparatus according to an embodiment may further include an operation of forming a pixel electrode 510, an auxiliary electrode 512, and the dummy electrode 514 on the display substrate D, an operation of forming a first organic insulating layer 417 including a first opening OP1 through which at least a part of the pixel electrode 510 is exposed to an exterior of the display substrate D, a second opening OP2 through which at least a part of the auxiliary electrode 512 is exposed to an exterior of the display substrate D, and a third opening OP3 through which at least a part of the dummy electrode 514 is exposed to an exterior of the display substrate D, and an operation of forming the organic functional layer 520e on the pixel electrode 510, the auxiliary electrode 512, and the dummy electrode 514 at least parts of which are exposed to an exterior of the display substrate D.

A substrate 400 may include glass or a polymer resin. The polymer resin may include polyethersulfone, polyacrylate, polyetherimide, polyethylene naphthalate, polyethylene terephthalate, polyphenylene sulfide, polyarylate, polyimide, polycarbonate, or cellulose acetate propionate. The substrate 400 including the polymer resin may be flexible, rollable, or bendable. The substrate 400 may have a multi-layer structure including a layer including the polymer resin and an inorganic layer (not shown).

A thin-film transistor TFT and storage capacitor Cst may be located on the substrate 400. The thin-film transistor TFT may include a semiconductor layer 434, a gate electrode 436, a source electrode 437, and a drain electrode 438, and the storage capacitor Cst may include a first electrode 444 and a second electrode 446.

A buffer layer 401 may be formed on the substrate 400. The buffer layer 401 may be located on the substrate 400, and may reduce or prevent penetration of a foreign material, moisture, or external air from the bottom of the substrate 400 and may planarize the substrate 400. The buffer layer 401 may include an inorganic material such as oxide or nitride, an organic material, or a combination of an organic material and an inorganic material, and may have a single or multi-layer structure including an inorganic material and an organic material. For example, the buffer layer 401 may include a first buffer layer and a second buffer layer.

The semiconductor layer 434 may be formed on the buffer layer 401. For example, the semiconductor layer 434 may be formed on the buffer layer 401, and may include polysilicon. As another example, the semiconductor layer 434 may include amorphous silicon. As another example, the semiconductor layer 434 may include an oxide of at least one material selected from the group consisting of indium (In), gallium (Ga), tin (Sn), zirconium (Zr), is vanadium (V), hafnium (Hf), cadmium (Cd), germanium (Ge), chromium (Cr), titanium (Ti), and zinc (Zn). The semiconductor layer 434 may include a channel region, and a source region and a drain region doped with impurities.

A first insulating layer 403 may be formed to cover the semiconductor layer 434. The first insulating layer 403 may include an inorganic insulating material such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide ($ZnO_2$). The first insulating layer 403 may have a single or multi-layer structure including the inorganic insulating material.

The gate electrode 436 may be formed on the first insulating layer 403 to overlap the semiconductor layer 434. The gate electrode 436 may include molybdenum (Mo), aluminum (Al), copper (Cu), or titanium (Ti), and may have a single or multi-layer structure. For example, the gate electrode 436 may have a single-layer structure including Mo.

A second insulating layer 405 may be provided to cover the gate electrode 436. The second insulating layer 405 may include an inorganic insulating material such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide ($ZnO_2$). The second insulating layer 405 may have a single or multi-layer structure including the inorganic insulating material.

The second electrode 446 of the storage capacitor Cst may be located on the second insulating layer 405.

The second electrode 446 may overlap the gate electrode 436 located under the second electrode 446. The gate electrode 436 and the second electrode 446 overlapping each other with the second insulating layer 405 therebetween may constitute the storage capacitor Cst. For example, the gate electrode 436 may be the first electrode 444 of the storage capacitor Cst. As another example, the first electrode 444 of the storage capacitor Cst may be provided as a separate independent element.

The second electrode 446 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may have a single or multi-layer structure including the above material.

A third insulating layer 407 may be formed to cover the second electrode 446. The third insulating layer 407 may include an inorganic insulating material such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($TazO_5$), hafnium oxide ($HfO_2$), or zinc oxide ($ZnO_2$). The third insulating layer 407 may have a single or multi-layer structure including the inorganic insulating material.

The source electrode 437 and the drain electrode 438 may be formed on the third insulating layer 407. Each of the source electrode 437 and the drain electrode 438 may include a conductive material including molybdenum (Mo), aluminum (Al), copper (Cu), or titanium (Ti), and may have a single or multi-layer structure including the above material. For example, each of the source electrode 437 and the drain electrode 438 may have a multi-layer structure including titanium (Ti)/aluminum (Al)/titanium (Ti).

A planarization layer 415 may be formed on the source electrode 437 and the drain electrode 438. The planarization layer 415 may have a flat top surface so that the pixel electrode 510, the auxiliary electrode 512, and the dummy electrode 514 located on the planarization layer 415 are flat.

The planarization layer 415 may include an organic material or an inorganic material, and may have a single or multi-layer structure. The planarization layer 415 may include benzocyclobutene (BCB), polyimide, hexamethyldisiloxane (HMDSO), a general-purpose polymer such as polymethyl methacrylate (PMMA) or polystyrene (PS), a polymer derivative having a phenol-based group, an acrylic polymer, an imide-based polymer, an aryl ether-based polymer, an amide-based polymer, a fluorinated polymer, a p-xylene-based polymer, or a vinyl alcohol-based polymer. The planarization layer 415 may include an inorganic insulating material such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide ($ZnO_2$). When the planarization layer 415 is formed, a layer may be formed and then chemical mechanical polishing may be performed on a top surface of the layer in order to provide a flat top surface.

Although one planarization layer is provided in FIG. 7, as another example, two planarization layers may be provided in alternative implementations. When two planarization layers are provided, it may be advantageous to have such a structure for high integration.

The pixel electrode 510, the auxiliary electrode 512, and the dummy electrode 514 may be formed on the planarization layer 415. The pixel electrode 510, the auxiliary electrode 512, and the dummy electrode 514 may be formed on the same layer.

Each of the pixel electrode 510, the auxiliary electrode 512, and the dummy electrode 514 may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). Each of the pixel electrode 510, the auxiliary electrode 512, and the dummy electrode 514 may include a reflective film including silver (Ag), magnesium (Mg), aluminum (Al), platinum (Pt), palladium (Pd), gold (Au), nickel (Ni), neodymium (Nd), iridium (Ir), chromium (Cr), or a compound thereof. For example, each of the pixel electrode 510, the auxiliary electrode 512, and the dummy electrode 514 may have a structure in which films formed of ITO, IZO, ZnO, or $In_2O_3$ are located over/under the reflective film. In this case, each of the pixel electrode 510, the auxiliary electrode 512, and the dummy electrode 514 may have a structure in which indium tin oxide (ITO), silver (Ag), and indium tin oxide (ITO) are stacked.

Referring to FIG. 8, the first organic insulating layer 417 may be formed on the pixel electrode 510, the auxiliary electrode 512, and the dummy electrode 514. The first organic insulating layer 417 may include the first opening OP1 through which at least a part of the pixel electrode 510 is exposed to an exterior of the display substrate D, the second opening OP2 through which at least a part of the auxiliary electrode 512 is exposed to an exterior of the display substrate D, and the third opening OP3 through which at least a part of the dummy electrode 514 is exposed to an exterior of the display substrate D. The first organic insulating layer 417 may be formed of an organic insulating material such as polyamide, polyamide, acrylic resin, benzocyclobutene, hexamethyldisiloxane (HMIDSO), or phenolic resin by using spin coating or the like.

Referring to FIG. 9, an emission layer 520b may be formed on the pixel electrode 510 at least part of which is exposed to an exterior of the display substrate D. The emission layer 520b may include a high molecular weight material or a low molecular weight material, and may emit red light, green light, blue light, or white light.

The organic functional layer 520e may be formed over and/or under the emission layer 520b. The organic functional layer 520e may include a first functional layer 520a and a second functional layer 520c.

The first functional layer 520a may be located under the emission layer 520b. The first functional layer 520a may have a single or multi-layer structure including an organic material. The first functional layer 520a may be a hole transport layer (HTL) having a single-layer structure. Alternatively, the first functional layer 520a may include a hole injection layer (HIL) and a hole transport layer (HTL).

The second functional layer 520c may be located over the emission layer 520b. The second functional layer 520c may have a single or multi-layer structure including an organic material. The second functional layer 520c may include an electron transport layer (ETL) and/or an electron injection layer (EIL).

The organic functional layer 520e may be formed on the pixel electrode 510, the auxiliary electrode 512, and the dummy electrode 514 at least parts of which are exposed. The organic functional layer 520e may be integrally provided to cover the pixel electrode 510, the auxiliary electrode 512, and the dummy electrode 514.

Figure 10:
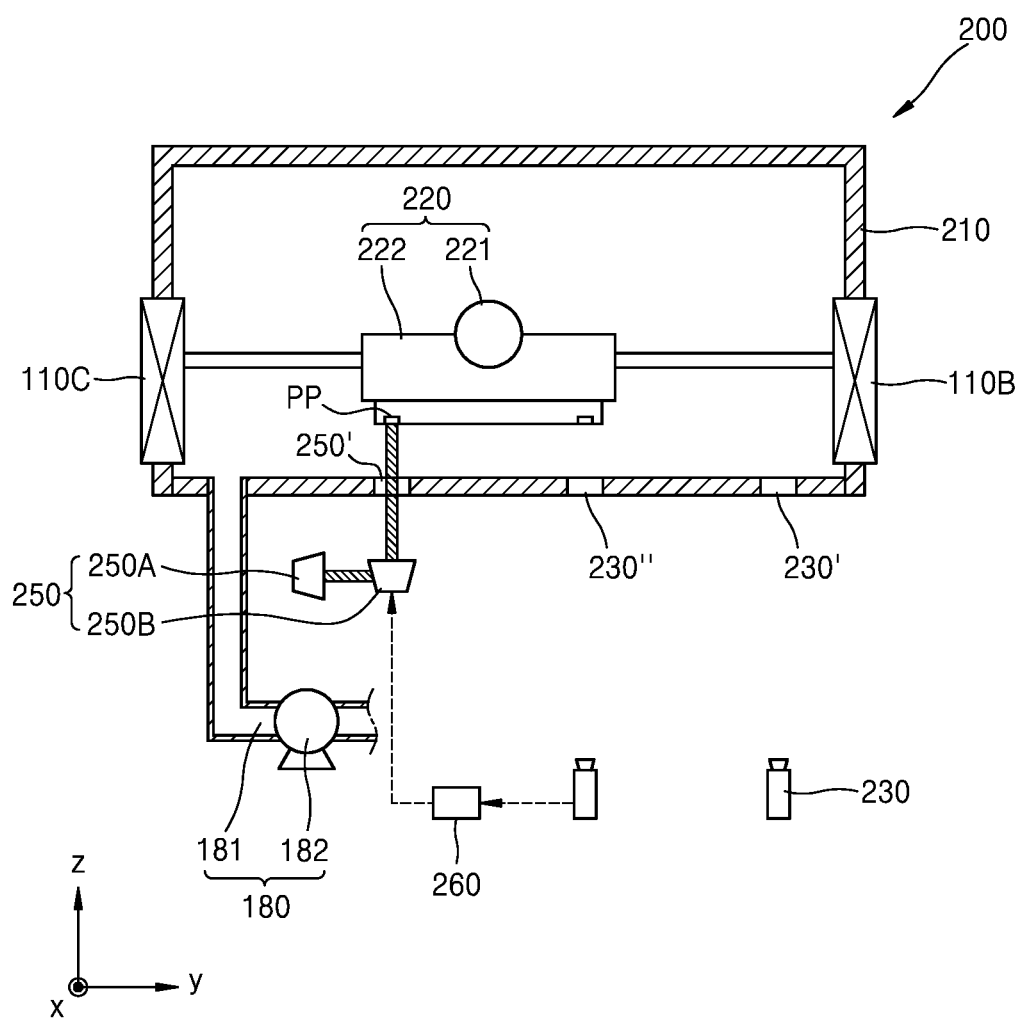
FIGS. 10 and 11 are cross-sectional views for describing a method of manufacturing a display apparatus according to an embodiment.
Figure 11:
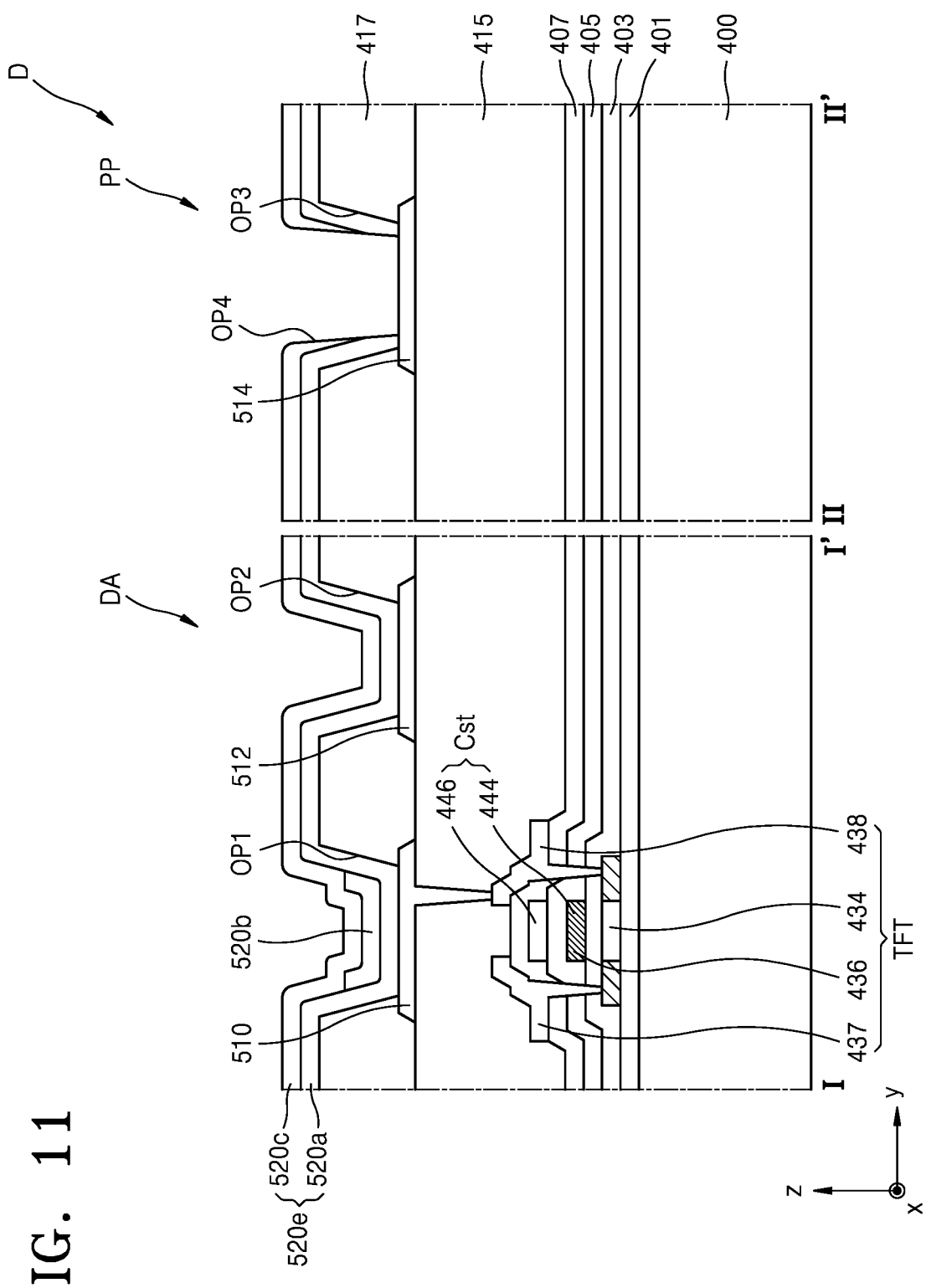
Figure 12A:
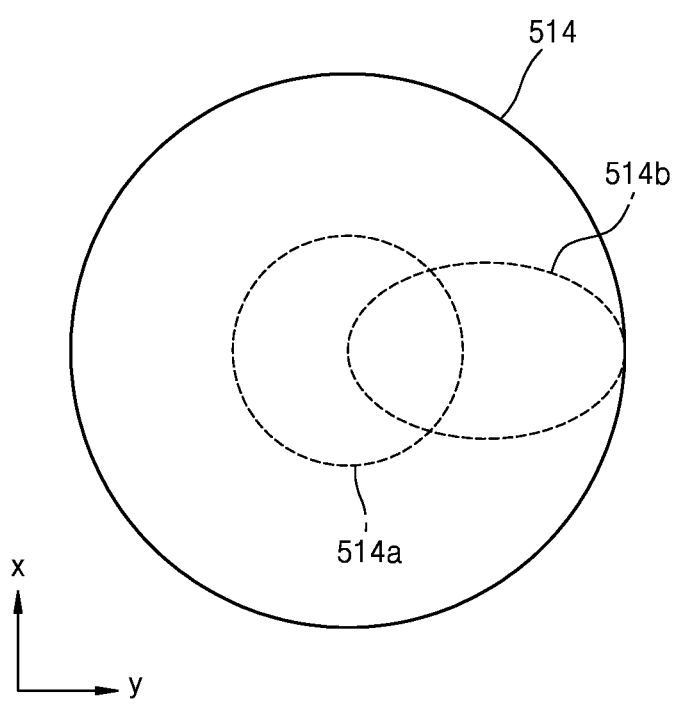
FIGS. 12A and 12B are plan views illustrating a dummy electrode according to an embodiment.
Figure 12B:
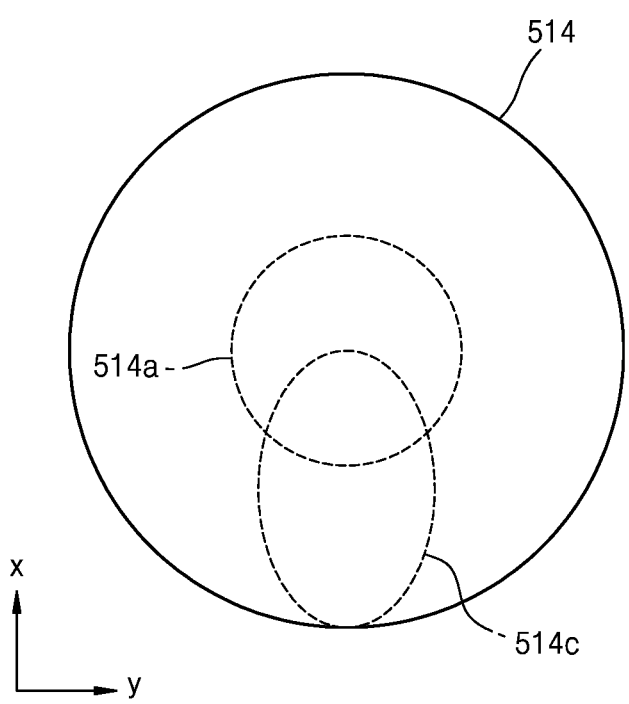

FIGS. 10 and 11 are cross-sectional views for describing a method of manufacturing a display apparatus according to an embodiment. FIGS. 12A and 12B are plan views illustrating a dummy electrode according to an embodiment.

Referring to FIGS. 10 and 11, after the display substrate D is aligned, the processor 250 may perform first drilling (etching) by irradiating a laser to the pattern part PP. In detail, the processor 250 may drill (etch) at least a part of the organic functional layer 520e formed on the pattern part PP by irradiating a laser to the pattern part PP. A fourth opening OP4 may be formed when at least a part of the organic functional layer 520e formed on the pattern part PP is drilled (etched).

The second measurement unit 230 may measure a surface of the organic functional layer 520e at least part of which is drilled (etched), and may transfer the measured data to the controller 260. The controller 260 may align the display substrate D by using the measured data, and may adjust one of the power density and power of the laser.

For example, the second measurement unit 230 may measure a position of an actually drilled (etched) point. The second measurement unit 230 may transfer the measured data to the controller 260. The controller 260 may align the display substrate D so that the actually drilled (etched) point is matched to a preset drilling (etching) point by using data measured by the second measurement unit 230, thereby improving drilling (etching) precision in the first direction (e.g., the x direction) and the second direction (e.g., the y direction). For example, as shown in FIG. 12A, when a preset drilling (etching) point 514a is not matched to an actually drilled (etched) point 514b, the display substrate D may be moved in the second direction (e.g., a −y direction) so that the preset drilling (etching) point 514a is matched to the actually drilled (etched) point 514b. Also, as shown in FIG. 12B, when the preset drilling (etching) point 514a is not matched to an actually drilled (etched) point 514c, the display substrate D may be moved in the first direction (e.g., the x direction) so that the preset drilling (etching) point 514a and the actually drilled (etched) point 514c are matched to each other. Accordingly, when the organic functional layer 520e formed on the auxiliary electrode 512 is etched, the preset drilling (etching) point and the actually drilled (etched) point may be matched to each other.

Also, the second measurement unit 230 may measure a shape and a depth in which the organic functional layer 520e is drilled (etched). The second measurement unit 230 may transfer the measured data to the controller 260. The controller 260 may control a drilled (etched) shape by using data measured by the second measurement unit 230. For example, as shown in FIGS. 12A and 12B, when the preset drilling (etching) shape 514a is a circular shape and the actually drilled (etched) shapes 514b and 514c are elliptical shapes, the controller 260 may control the processor 250 so that the actually drilled (etched) shapes 514b and 514c are circular shapes. Accordingly, when the organic functional layer 520e formed on the auxiliary electrode 512 is drilled (etched), the organic functional layer 520e may be drilled (etched) into a desired shape.

Also, the controller 260 may control a drilled (etched) depth by using data measured by the second measurement unit 230. For example, when the organic functional layer 520e formed on the dummy electrode 514 is not completely drilled (etched) (when a drilled (etched) depth is small), the organic functional layer 520e formed on the dummy electrode 514 may be completely drilled (etched) by increasing the power density and power of a laser. Also, when a part of the dummy electrode 514 is drilled (etched) (when a drilled (etched) depth is deep), that is, when over-drilling (etching) occurs, only the organic functional layer 520e formed on the dummy electrode 514 may be drilled (etched) by reducing the power density and power of a laser. Accordingly, drilling (etching) precision in a third direction (e.g., a z direction) may be improved, and when the organic functional layer 520e formed on the auxiliary electrode 512 is drilled (etched), only the organic functional layer 520e may be drilled (etched).

Figure 13:
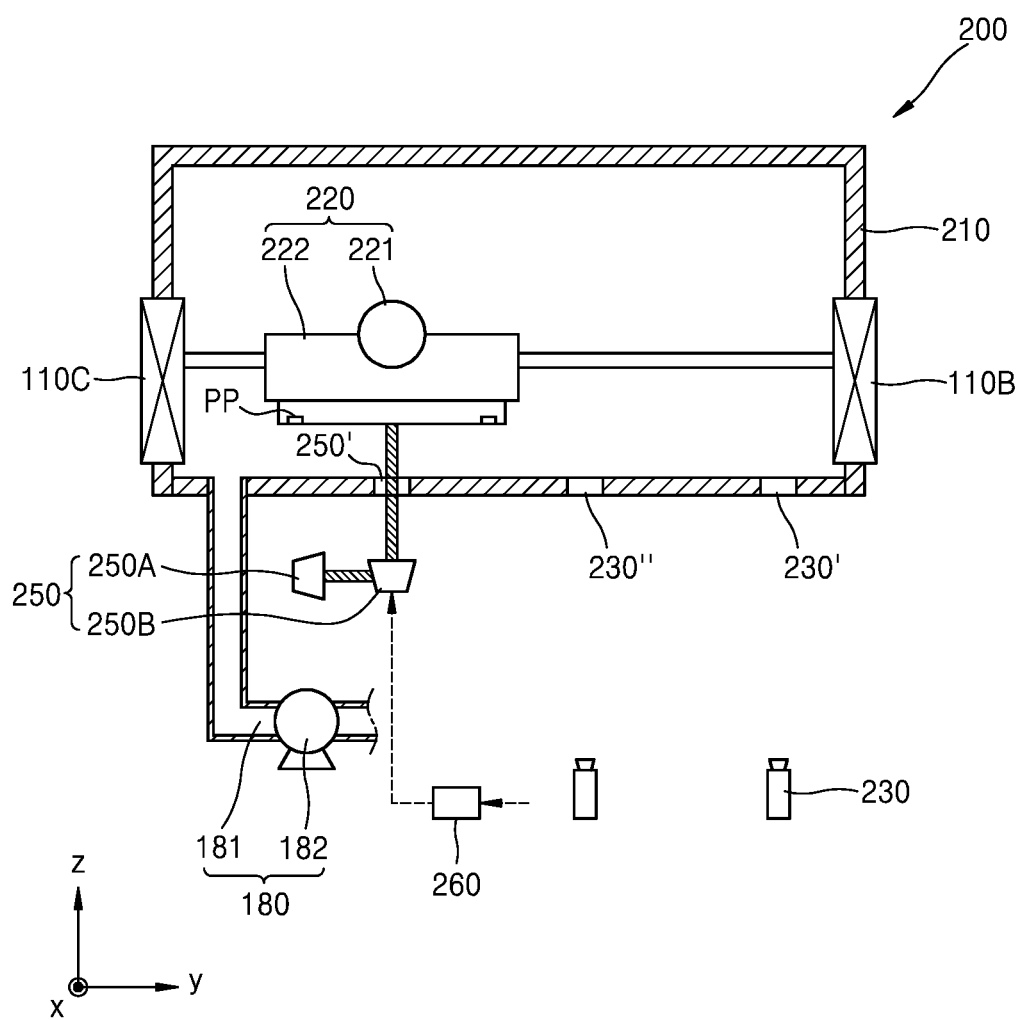
FIGS. 13 and 14 are cross-sectional views for describing a method of manufacturing a display apparatus according to an embodiment.
Figure 14:
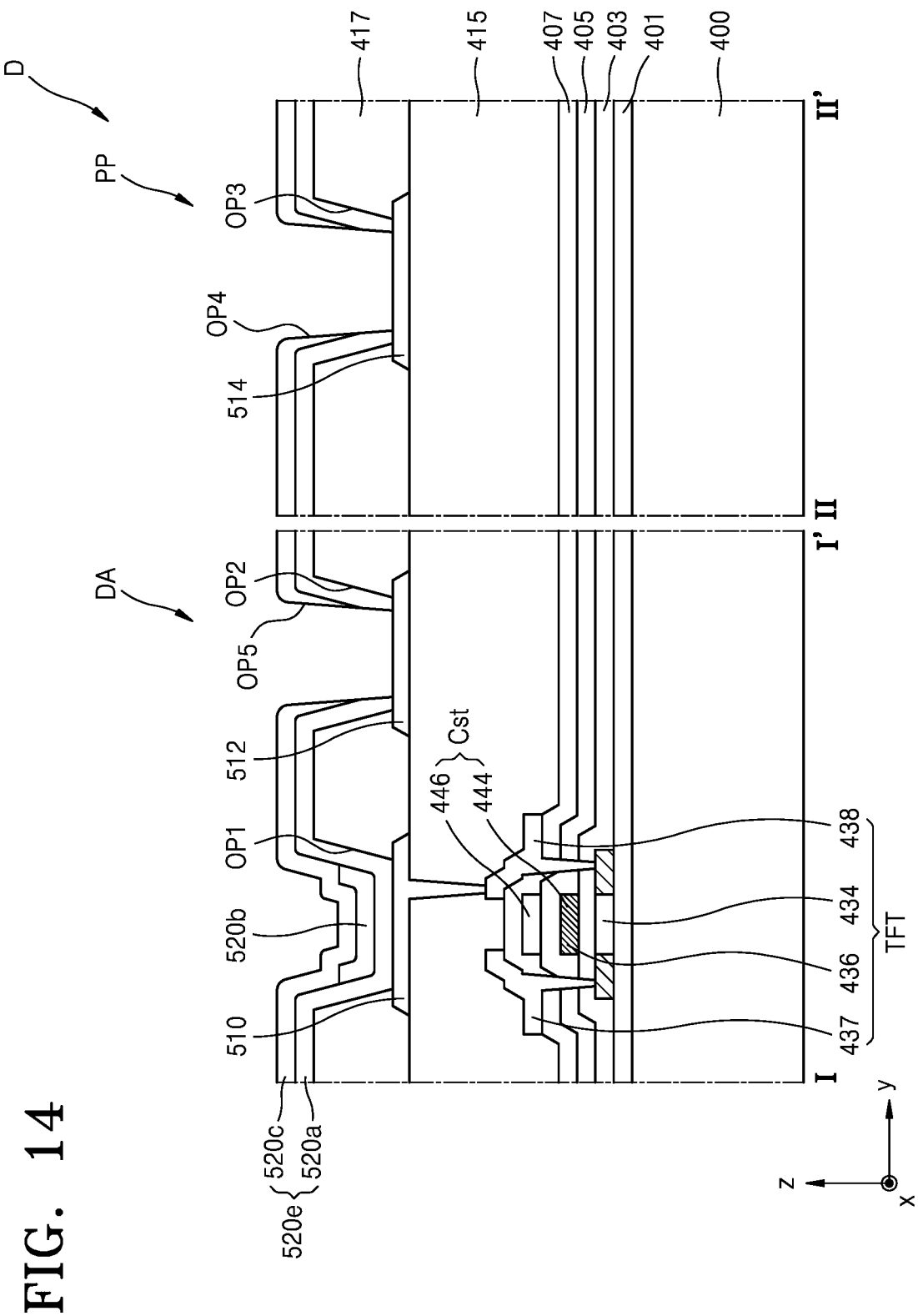

FIGS. 13 and 14 are cross-sectional views for describing a method of manufacturing a display apparatus according to an embodiment.

Referring to FIGS. 13 and 14, in a second laser drilling operation, drilling (etching) may be performed by irradiating a laser to the display substrate D. In detail, the processor 250 may drill (etch) at least a part of the organic functional layer 520e by irradiating a laser to the organic functional layer 520e formed on the auxiliary electrode 512.

A fifth opening OP5 may be formed when the organic functional layer 520e formed on the auxiliary electrode 512 is drilled (etched) by a laser. At least a part of the auxiliary electrode 512 may be exposed to the outside through the fifth opening OP5.

When over-drilling (etching) occurs during a laser drilling (etching) process of the organic functional layer 520e formed on the auxiliary electrode 512, the auxiliary electrode 512 may be damaged. When the organic functional layer 520e is not completely drilled (etched), the auxiliary electrode 512 and a counter electrode 530 formed over the auxiliary electrode 512 may not directly contact each other, thereby reducing the quality of a product.

However, according to an embodiment, for example, before a laser drilling (etching) process is performed on the organic functional layer 520e formed on the auxiliary electrode 512, laser drilling (etching) may be performed on the organic functional layer 520e formed on the dummy electrode 514, a drilled (etched) position, shape, and depth may be measured by using the second measurement unit 230, and the controller 260 may control (adjust) the processor 250 by using the measured data, thereby improving the laser drilling (etching) precision of the organic functional layer 520e and improving the quality of a product.

Figure 15:
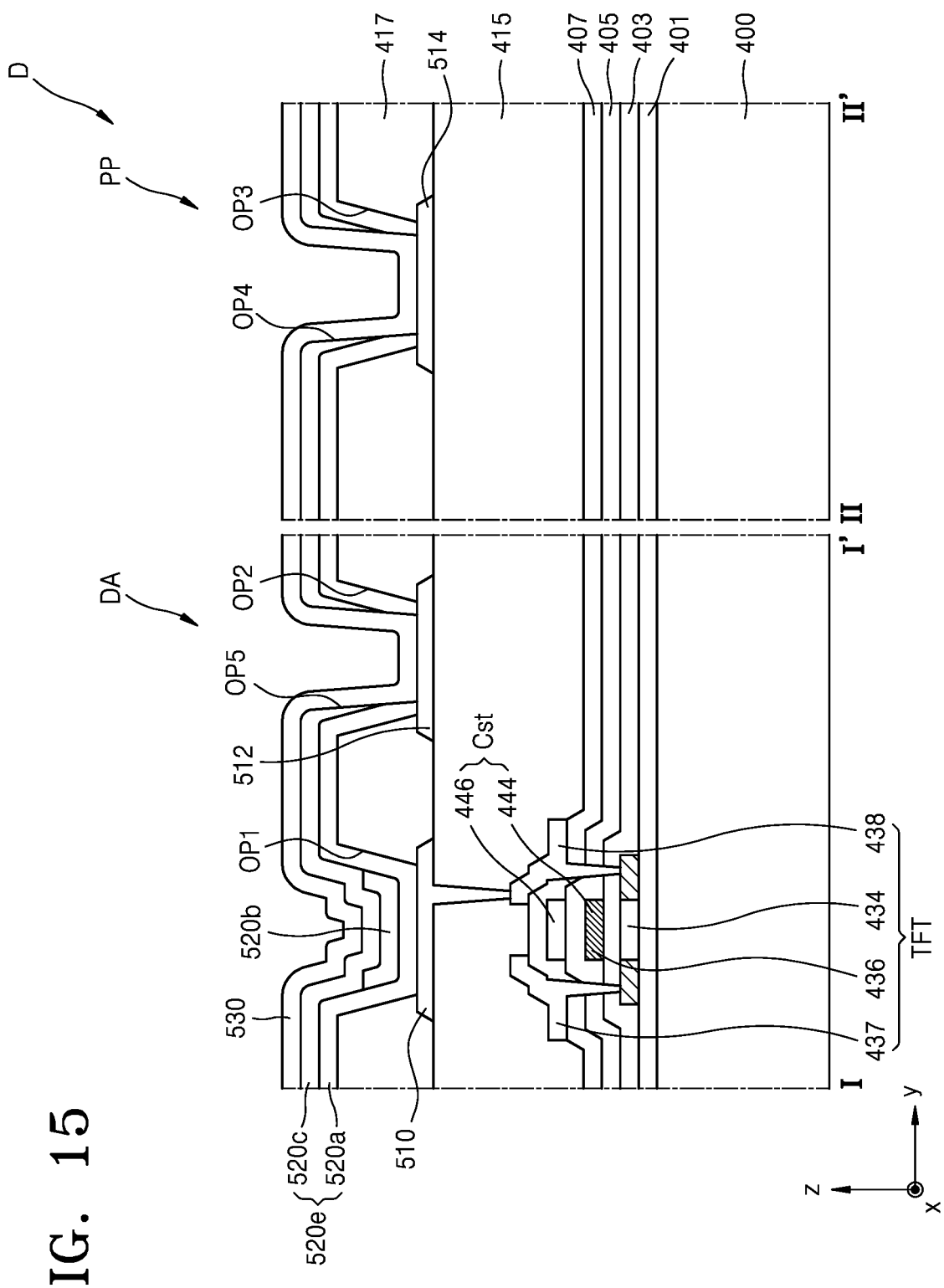
FIG. 15 is a cross-sectional view for describing a method of manufacturing a display apparatus according to an embodiment.

FIG. 15 is a cross-sectional view for describing a method of manufacturing a display apparatus according to an embodiment.

Referring to FIG. 15, after a second drilling operation of performing second drilling by irradiating a laser to the display substrate D, an operation of forming the counter electrode 530 on the pixel electrode 510 and the auxiliary electrode 512 may be further performed.

For example, because the organic functional layer 520e formed on the pixel electrode 510 is not drilled (etched) by a laser, the organic functional layer 520e may be formed on the pixel electrode 510 and the counter electrode 530 may be formed on the organic functional layer 520e.

A display panel may include a display area DA in which pixels are located and a non-display area NDA in which pixels are not located and that is located around the display area DA. Driving circuits for driving pixels may be located in the non-display area NDA, and the driving circuits and the pixels may be electrically connected to each other through wirings. In the case of a large-area panel, there is a problem that lengths of wirings are increased, and thus the resistance of the wirings increases and, in particular, the luminance of pixels located in the center of the display area DA decreases.

However, according to an embodiment, for example, because the organic functional layer 520e formed on the auxiliary electrode 512 is drilled (etched) by a laser, the counter electrode 530 may be formed directly on the auxiliary electrode 512. Because the counter electrode 530 is formed on the auxiliary electrode 512, the auxiliary electrode 512 and the counter electrode 530 may directly contact each other and may efficiently transfer power to the counter electrode 530, thereby preventing or minimizing the luminance of pixels located in the center of the display area DA from being reduced.

Because the organic functional layer 520e formed on the dummy electrode 514 is drilled (etched) by a laser, the counter electrode 530 may be formed directly on the dummy electrode 514. The dummy electrode 514 and the counter electrode 530 may directly contact each other.

Figure 16:
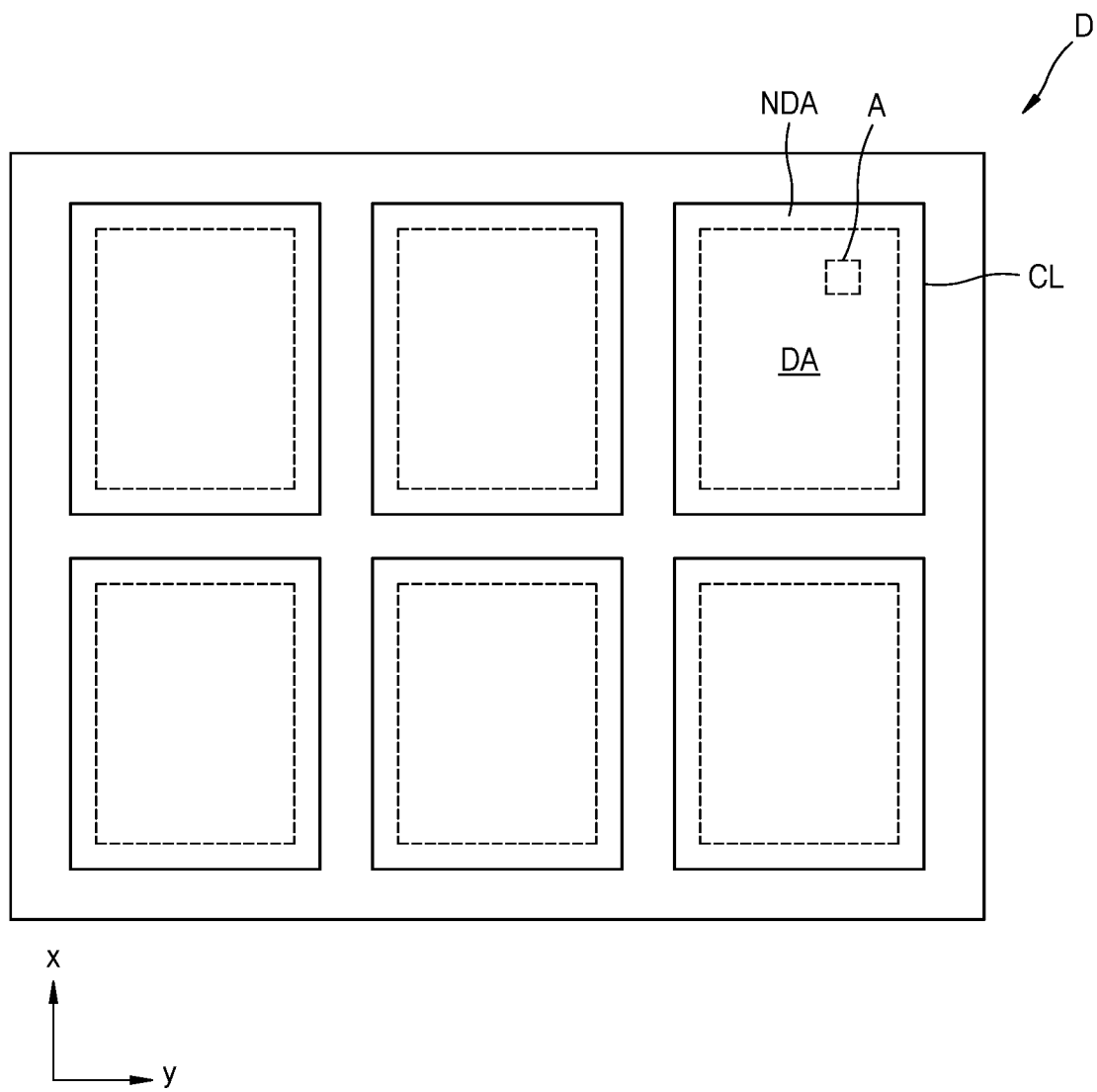
FIG. 16 is a plan view illustrating a display substrate according to an embodiment.
Figure 17:
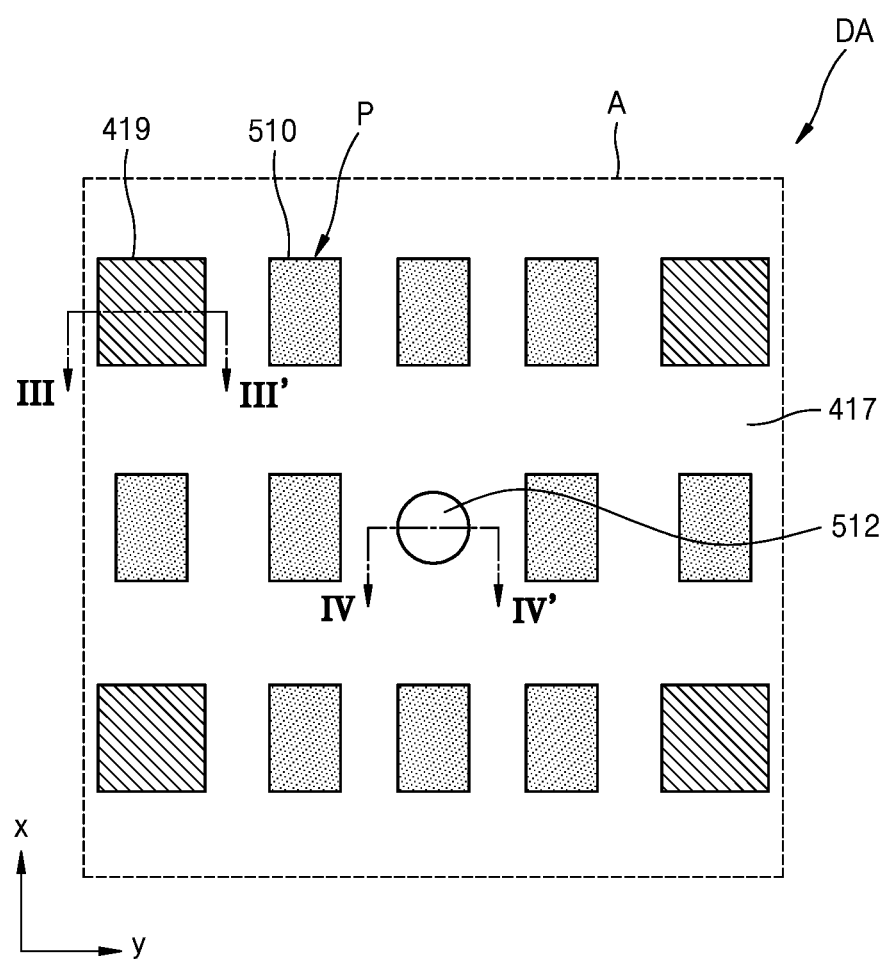
FIG. 17 is an enlarged plan view illustrating a portion A of FIG. 16.

FIG. 16 is a plan view illustrating a display substrate according to an embodiment. FIG. 17 is an enlarged plan view illustrating a portion A of FIG. 16. An embodiment of FIG. 16 is different from an embodiment of FIG. 5 in that a pattern part is provided in the display area DA. In FIG. 16, the same elements as those illustrated in FIG. 5 are denoted by the same reference numerals, and thus a repeated description thereof will be omitted.

Referring to FIGS. 16 and 17, the display substrate D may include a plurality of display areas DA that are spaced apart from one another and a plurality of non-display areas NDA surrounding the plurality of display areas DA. The display substrate D may include the cutting line CL. The plurality of display areas DA may be divided by the cutting lines CL. A pixel P may be located in the display area DA.

A second organic insulating layer 419 may be formed on the first organic insulating layer 417. The second organic insulating layer 419 may be integrally formed with the first organic insulating layer 417. For example, the second organic insulating layer 419 and the first organic insulating layer 417 may be formed in the same process by using a halftone mask.

FIGS. 18 through 22 are cross-sectional views for describing a method of manufacturing a display apparatus according to an embodiment. FIGS. 18 through 22 are cross-sectional views taken along lines and IV-IV' of FIG. 17.

Figure 18:
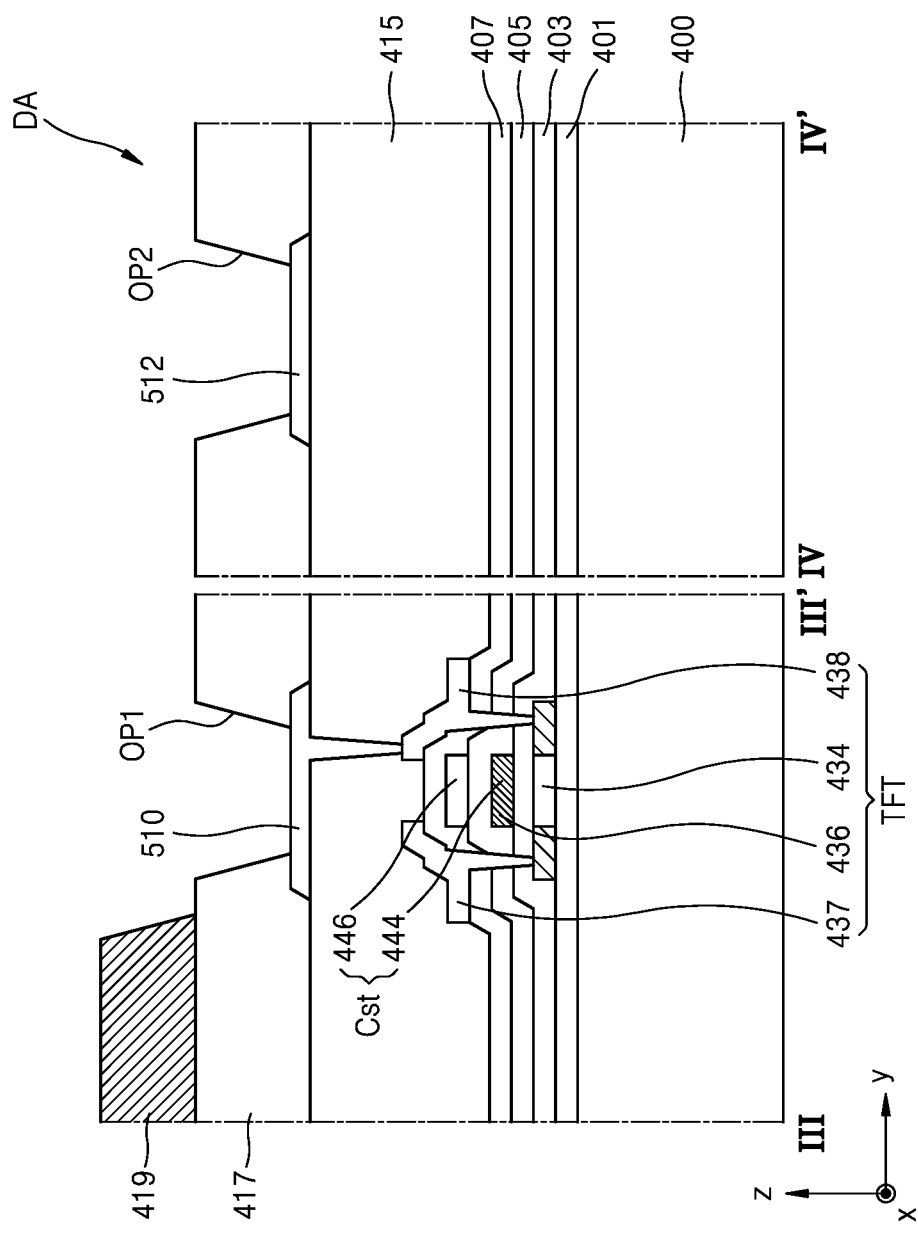

Referring to FIG. 18, the pixel electrode 510 and the auxiliary electrode 512 may be formed on the planarization layer 415. The pixel electrode 510 and the auxiliary electrode 512 may be formed on the same layer. The first organic insulating layer 417 may be formed on the pixel electrode 510 and the auxiliary electrode 512. The first organic insulating layer 417 may include the first opening OP1 through which at least a part of the pixel electrode 510 is exposed to an exterior of the display substrate D, and the second opening OP2 through which at least a part of the auxiliary electrode 512 is exposed to an exterior of the display substrate D. The second organic insulating layer 419 may be formed on the first organic insulating layer 417.

Figure 19:
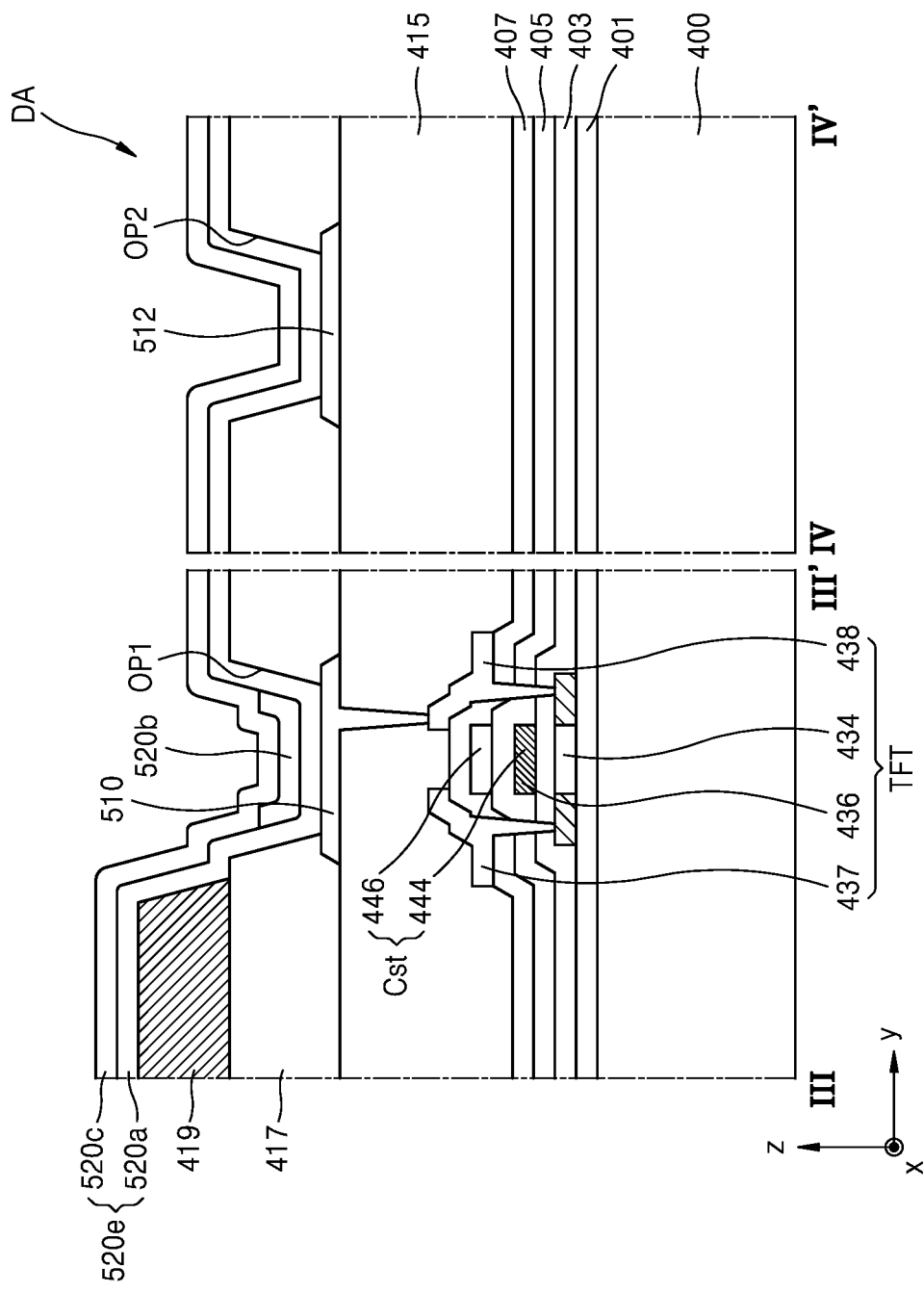

Referring to FIG. 19, the organic functional layer 520e may be formed on the pixel electrode 510 and the auxiliary electrode 512. The organic functional layer 520e may include the first functional layer 520a and the second functional layer 520c. The emission layer 520b may be formed between the first functional layer 520a and the second functional layer 520c formed on the pixel electrode 510.

For example, the organic functional layer 520e may be integrally formed to entirely cover the display area DA. Accordingly, the organic functional layer 520e may be formed even on the first organic insulating layer 417 and the second organic insulating layer 419.

For example, the second organic insulating layer 419 and the auxiliary electrode 512 may function as the pattern part PP (see FIG. 5). For example, instead of performing laser drilling (etching) on the organic functional layer 520e formed on the dummy electrode 514 (see FIG. 11) that is separately provided and measuring a drilled (etched) surface, laser drilling (etching) may be performed on the organic functional layer 520e formed on the second organic insulating layer 419 and a drilled (etched) surface may be measured to obtain information such as a drilled (etched) position, shape, and depth. Also, the measured information may be transferred to the controller 260 (see FIG. 10), and the controller 260 may align the display substrate D and may adjust one of the power density and power of a laser. Accordingly, drilling (etching) precision not only in the first direction (e.g., the x direction) and the second direction (e.g., the y direction) but also in the third direction (e.g., the z direction) may be improved.

Figure 20:
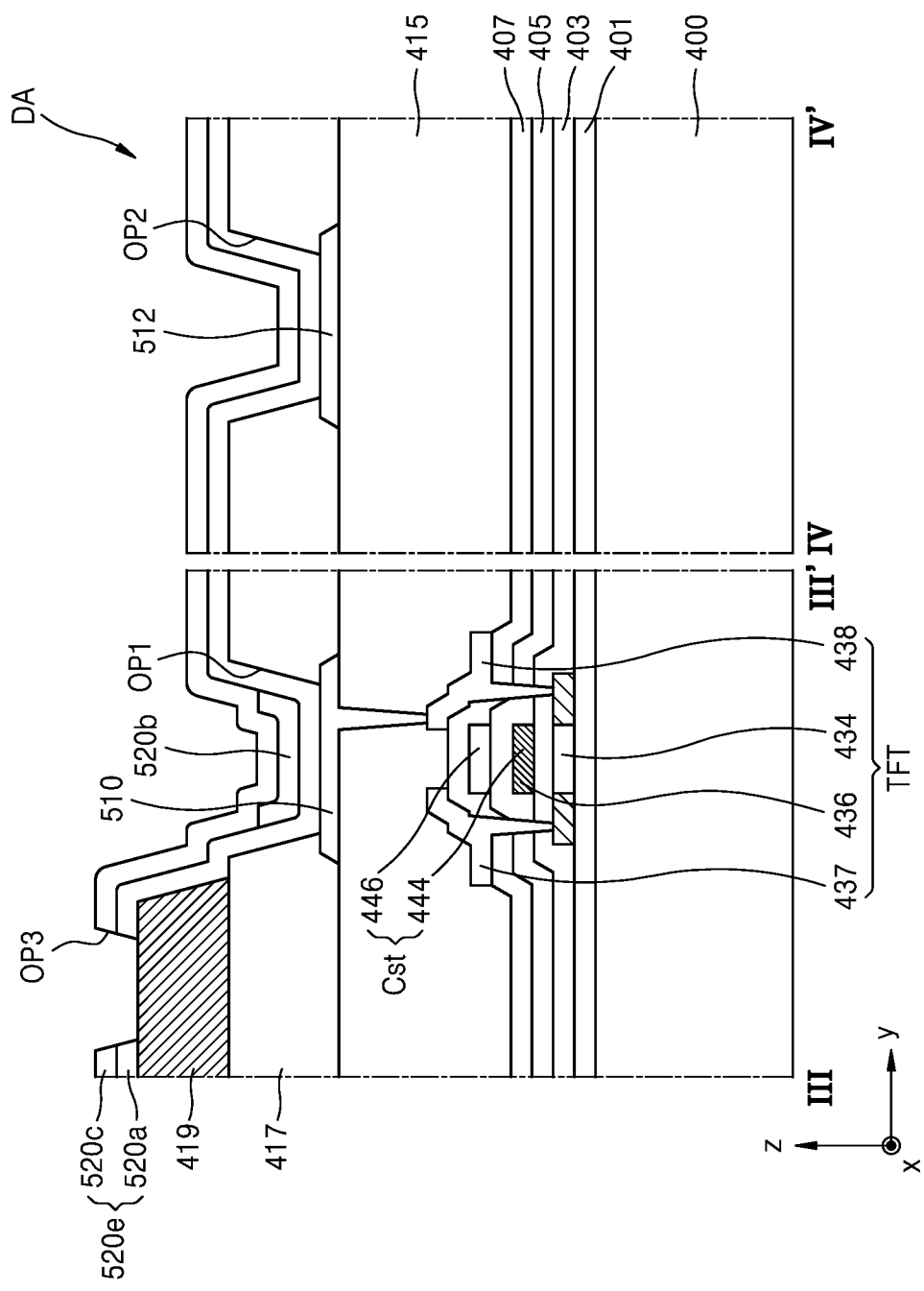

Referring to FIG. 20, the processor 250 (see FIG. 10) may perform first drilling (etching) by irradiating a laser to the organic functional layer 520e formed on the second organic insulating layer 419. In detail, the processor 250 may etch at least a part of the organic functional layer 520e, by irradiating a laser to the organic functional layer 520e formed on the second organic insulating layer 419. The third opening OP3 may be formed when at least a part of the organic functional layer 520e formed on the second organic insulating layer 419 is drilled (etched).

The second measurement unit 230 (see FIG. 10) may measure a surface of the organic functional layer 520e at least part of which is drilled (etched), and may transfer the measured data to the controller 260 (see FIG. 10). The controller 260 may align the display substrate D by using the measured data, and may adjust at least one of the power density and power of the laser.

Because the second measurement unit 230 may measure a surface of the organic functional layer 520e at least part of which is drilled (etched) and may align the display substrate D by using the measured data, drilling (etching) precision in the first direction (e.g., the x direction) and the second direction (e.g., the y direction) may be improved. Because at least one of the power density and power of the laser may be adjusted by using the measured data, drilling (etching) precision in the third direction (e.g., the z direction) may be improved.

For example, the auxiliary electrode 512 formed in the display area DA may function as the alignment key AK (see FIG. 6B).

Figure 21:
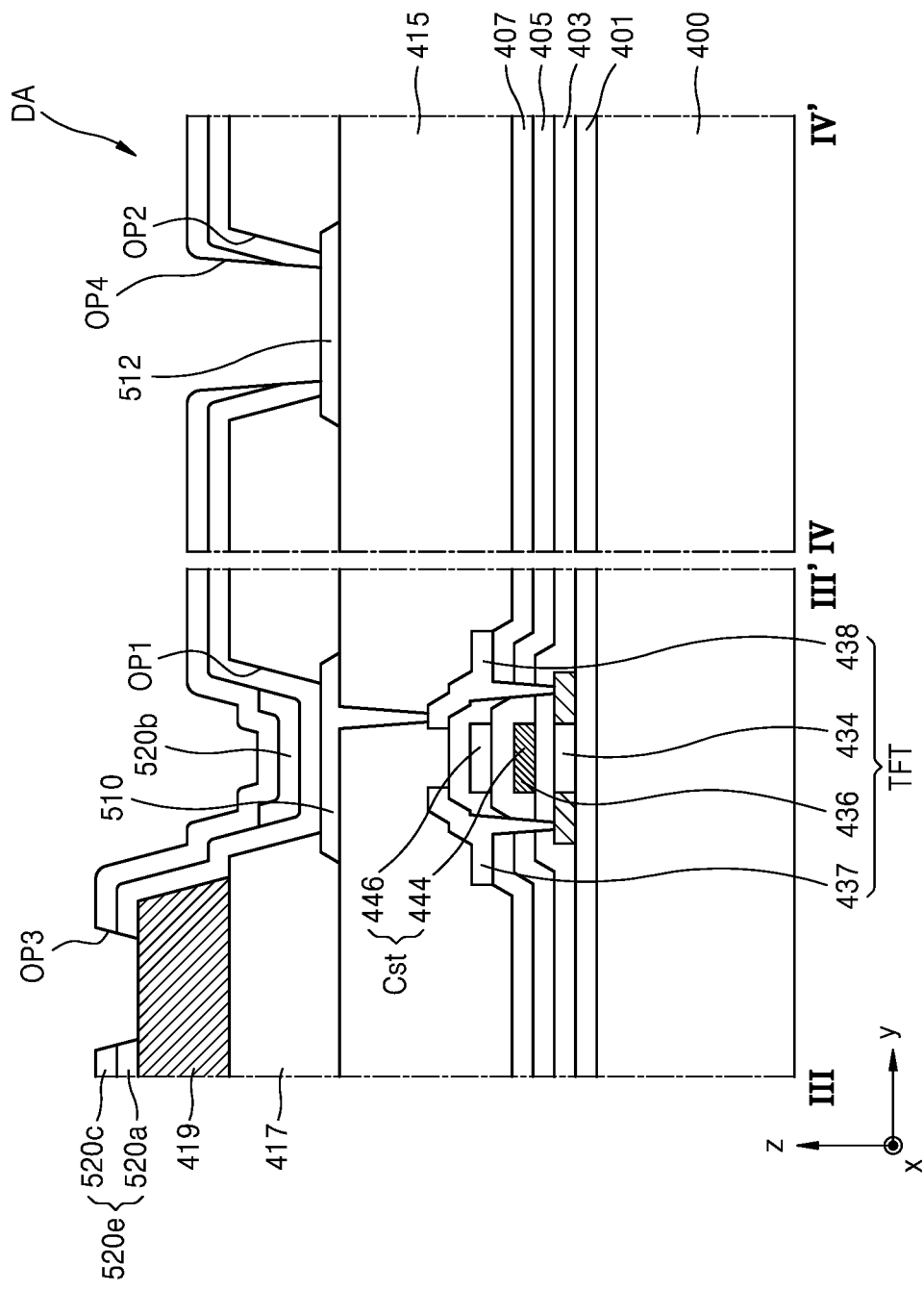

Referring to FIG. 21, after the display substrate D is aligned by using measured data and at least one of the power density and power of a laser is adjusted, a second laser drilling operation may be performed.

In the second laser drilling operation, the processor 250 may drill (etch) at least a part of the organic functional layer 520e by irradiating a laser to the organic functional layer 520e formed on the auxiliary electrode 512.

The fourth opening OP4 may be formed when the organic functional layer 520e formed on the auxiliary electrode 512 is drilled (etched) by a laser. At least a part of the auxiliary electrode 512 may be exposed to the outside through the fourth opening OP4.

Referring to FIG. 22, after the second laser drilling operation, an operation of forming the counter electrode 530 on the pixel electrode 510 and the auxiliary electrode 512 may be further performed.

For example, because the organic functional layer 520e formed on the pixel electrode 510 is not drilled (etched) by a laser, the organic functional layer 520e may be formed on the pixel electrode 510 and the counter electrode 530 may be formed on the organic functional layer 520e.

For example, because the organic functional layer 520e formed on the auxiliary electrode 512 is drilled (etched) by a laser, the counter electrode 530 may be formed directly on the auxiliary electrode 512. Because the counter electrode 530 is formed on the auxiliary electrode 512, the auxiliary electrode 512 and the counter electrode 530 may directly contact each other and may efficiently transfer power to the counter electrode 530, thereby preventing or minimizing the luminance of pixels located in the center of the display area DA from being reduced.

For example, before laser drilling (etching) is performed on the organic functional layer 520e formed on the auxiliary electrode 512, laser drilling (etching) may be performed on the organic functional layer 520e formed on the dummy electrode 514, information such as a drilled (etched) position, shape, and depth may be measured by using the second measurement unit 230, and the controller 260 may control the processor 250 by using the measured information, thereby improving the laser drilling (etching) precision of the organic functional layer 520e actually formed on the auxiliary electrode 512.

Also, because at least a part of the organic functional layer 520e formed on the auxiliary electrode 512 is drilled (etched), the auxiliary electrode 512 and the counter electrode 530 may directly contact each other and may efficiently transfer power to the counter electrode 530, thereby preventing or minimizing the luminance of pixels located in the center of the display area DA from being reduced.

As described above, according to an embodiment, laser etching may be performed on a pattern part formed on a side of a display substrate and the power density and power of a laser may be adjusted by using etched information, thereby improving processing precision. However, the disclosure is not limited by these effects.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A method of manufacturing a display apparatus, the method comprising:
    forming a pixel electrode, an auxiliary electrode, and a dummy electrode on a display substrate;
    forming a first organic insulating layer comprising a first opening through which at least a part of the pixel electrode is exposed, a second opening through which at least a part of the auxiliary electrode is exposed, and a third opening through which at least a part of the dummy electrode is exposed;
    forming an organic functional layer on the first organic insulating layer and on at least parts of the pixel electrode, the auxiliary electrode, and the dummy electrode that are exposed;
    aligning a display substrate comprising a pattern part including the dummy electrode and the organic functional layer covering the dummy electrode;
    performing first drilling by causing a laser to irradiate the pattern part;
    measuring a surface of the first-drilled pattern part, and adjusting at least one of a power density or a power of the laser based on the measuring; and
    performing second drilling by causing the laser to irradiate the display substrate having the first-drilled pattern part by using the at least one of the adjusted power density or the adjusted power.

2. A method of manufacturing a display apparatus, the method comprising:
    aligning a display substrate comprising a pattern part;
    performing first drilling by causing a laser to irradiate the pattern part;
    measuring a surface of the first-drilled pattern part, and adjusting at least one of a power density or a power of the laser; and
    performing second drilling by causing the laser to irradiate the display substrate having the first-drilled pattern part by using the at least one of the adjusted power density or the adjusted power,
    wherein before the aligning of the display substrate comprising the pattern part, the method further comprises:
        forming a pixel electrode, an auxiliary electrode, and a dummy electrode on the display substrate;
        forming a first organic insulating layer comprising a first opening through which at least a part of the pixel electrode is exposed to an exterior of the display substrate, a second opening through which at least a part of the auxiliary electrode is exposed to an exterior of the display substrate, and a third opening through which at least a part of the dummy electrode is exposed to an exterior of the display substrate; and
        forming an organic functional layer on the pixel electrode, the auxiliary electrode, and the dummy electrode at least parts of which are exposed to an exterior of the display substrate.

3. The method of claim 2, wherein the pixel electrode, the auxiliary electrode, and the dummy electrode are formed on a same layer.

4. The method of claim 2, wherein the pattern part comprises the dummy electrode, and the organic functional layer located on the dummy electrode, wherein the performing of the first drilling by causing the laser to irradiate the pattern part comprises etching at least a part of the organic functional layer by causing the laser to irradiate the organic functional layer located on the dummy electrode.

5. The method of claim 2, wherein the performing of the second drilling by causing the laser to irradiate the display substrate comprises etching at least a part of the organic functional layer by causing the laser to irradiate the organic functional layer located on the auxiliary electrode.

6. The method of claim 2, after the performing of the second drilling by irradiating the laser to the display substrate, the method further comprising forming a counter electrode on the pixel electrode and the auxiliary electrode.

7. The method of claim 6, wherein the organic functional layer is located between the pixel electrode and the counter electrode, and the auxiliary electrode and the counter electrode directly contact each other.

* * * * *